(12) United States Patent
Zaifrani et al.

(10) Patent No.: US 8,351,104 B2
(45) Date of Patent: Jan. 8, 2013

(54) CONTROLLABLY COUPLED PIEZOELECTRIC MOTORS

(76) Inventors: Silvio Zaifrani, Haifa (IL); Gal Peled, Kibbutz Ein Hachoresh (IL); Gal Eshed, Atlit (IL); Shaul Hasson, Moshav Bet Arif (IL); Nir Karasikov, Haifa (IL)

( * ) Notice: Subject to any disclaimer, the term of this patent is extended or adjusted under 35 U.S.C. 154(b) by 701 days.

(21) Appl. No.: 12/398,216

(22) Filed: Mar. 5, 2009

(65) Prior Publication Data

US 2009/0225388 A1  Sep. 10, 2009

(30) Foreign Application Priority Data

Mar. 6, 2008  (GB) .................................. 0804178.2

(51) Int. Cl.
*G02B 26/08* (2006.01)
(52) U.S. Cl. .................................................. 359/225.1
(58) Field of Classification Search .... 359/223.1–226.1; 310/236.16, 323.16, 328
See application file for complete search history.

(56) References Cited

U.S. PATENT DOCUMENTS

| | | | |
|---|---|---|---|
| 5,453,653 A | 9/1995 | Zumeris | |
| 6,100,517 A | 8/2000 | Yahav et al. | |
| 6,243,218 B1 | 6/2001 | Whitehead | |
| 6,384,515 B1 * | 5/2002 | Ganor et al. | 310/328 |
| 6,661,153 B1 | 12/2003 | Shiv et al. | |
| 6,879,085 B1 | 4/2005 | Shiv et al. | |
| 7,075,211 B1 | 7/2006 | Ganor et al. | |
| 7,388,700 B1 * | 6/2008 | Odhner | 359/224.1 |

* cited by examiner

*Primary Examiner* — Euncha Cherry

(57) ABSTRACT

A mirror system comprising: a mirror; at least one piezoelectric motor having a coupling surface for coupling the motor to a moveable body; at least one spherical contact surface coupled to the mirror; and a motor mounting frame that holds a piezoelectric motor of the at least one piezoelectric motor and presses the piezoelectric motor coupling surface to a contact surface of the spherical contact surface; wherein the motor is controllable to apply force to the contact surface that rotates the mirror.

24 Claims, 18 Drawing Sheets

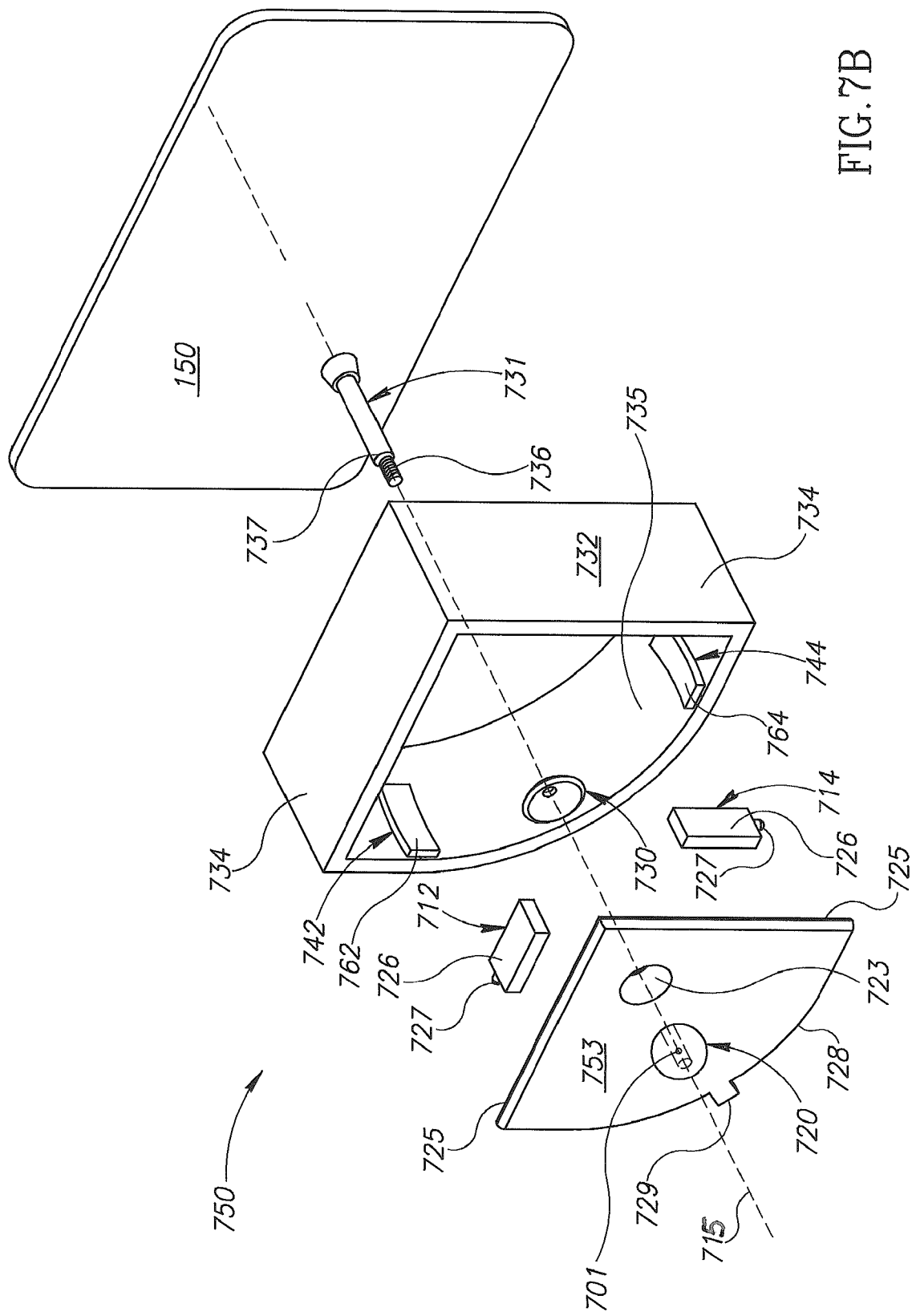

CONTROLLABLY COUPLED PIEZOELECTRIC MOTORS

CROSS-REFERENCES TO RELATED APPLICATIONS

The present application claims benefit under 35 U.S.C. §119(a)-(d) of British Application 0804178.2 filed Mar. 6, 2008, the entire content of which is incorporated herein by reference.

FIELD OF THE DISCLOSURE

The disclosure relates to methods of coupling a piezoelectric motor to a moveable body.

BACKGROUND

A piezoelectric motor uses a piezoelectric vibrator to transduce electrical energy into kinetic energy that the motor transmits to a moveable body to which the motor is coupled. The motor is generally coupled to the body by resiliently pressing the motor to the body so that a surface region, hereinafter referred to as a "coupling surface", of the piezoelectric vibrator contacts a surface region of the body. Electrodes in the motor are electrified to excite vibrations in the vibrator that cause the coupling surface to vibrate. Motion is transmitted from the vibrating coupling surface to move the body by frictional forces between the coupling surface and the surface region, hereinafter a "contact surface", of the body to which the coupling surface is pressed. A suitable elastic element, generally a coil or leaf spring, provides a "coupling force" that resiliently presses the motor coupling surface to the contact surface of the body.

Often, a coupling surface of a piezoelectric motor comprises a shaped protuberance, a "friction nub" made from a hard, wear resistant material that is mounted to a surface of the motor. Friction nubs may be formed from Alumina, a high impact plastic such as PEEK (polyethyl ethyl ketone) or a cermet alloy. "Cermet" refers to an alloy formed by bonding ceramic particles with a metal such as, for example, Ti, W, Ta or Mo. Cermet alloys of different composition and characteristics are well known in the art and are used, for example, for bearings, seals and cutting tools.

For a given motor coupling surface, such as a friction nub, used to transmit energy from a piezoelectric motor to a moveable body, the nub and the contact surface of the moveable body to which the nub is pressed undergo relatively rapid mutual wear during an initial run-in period of use. Wear during the run-in period engenders mutual shaping and surface conditioning of the nub and motor contact surface that fine tunes matching of the nub and contact surface to each other. As the fine tune matching of the surfaces progresses, control of motion and positioning of the body by the piezoelectric motor improves and stabilizes, and rate of wear of the surfaces asymptotes to a relatively moderate, steady state wear rate.

U.S. Pat. No. 5,453,653, the disclosure of which is incorporated herein by reference, describes a piezoelectric motor having a friction nub bonded to an edge surface of a thin rectangular piezoelectric vibrator having relatively large parallel planar face surfaces and narrow edge surfaces. Electrodes on the face surfaces of the vibrator are electrified to excite and control vibrations in the vibrator and thereby in the vibrator friction nub in a plane parallel to the planes of the face surfaces. An elastic element that applies force to an edge surface of the vibrator opposite the edge surface to which the friction nub is bonded provides a resilient coupling force that couples the motor friction nub to a contact surface of a moveable body.

U.S. Pat. No. 7,075,211, the disclosure of which is incorporated herein by reference, describes piezoelectric motors comprising a rectangular vibrator having large planar face surfaces and a friction nub on a narrow edge surface of the vibrator that can be excited to generate vibrations in the nub selectively in or perpendicular to the plane of the vibrator.

Some piezoelectric motors have a relatively large coupling surface rather than a relatively localized coupling surface such as a friction nub. For example, traveling wave piezoelectric motors generally use a relatively large extended surface of a piezoelectric vibrator as a coupling surface.

U.S. Pat. No. 6,243,218 B1, the disclosure of which is incorporated herein by reference, describes a mirror actuator in which a pair of preferably linear traveling wave piezoelectric motors are used to rotate an exterior rear view mirror of a vehicle. Each motor provides linear motion to a rod to which it and a mirror assembly are connected such that a linear pushing or pulling of the rod causes the mirror assembly to rotate around a pivot point. The rods are appropriately positioned with respect to the pivot point to provide independent horizontal and vertical pivoting of the mirror around the pivot point.

SUMMARY

An aspect of some embodiments of the invention relates to providing a movable body coupled to at least one piezoelectric motor operable to control motion and orientation of the moveable body wherein the moveable body is a mirror.

According to an aspect of an embodiment of the invention, a motor of the at least one motor is coupled to the mirror using a coupling apparatus that can be controlled to provide different magnitudes of resilient force for coupling the motor to the mirror.

According to an aspect of some embodiments of the invention, the coupling apparatus is controllable to provide at least two coupling states for the piezoelectric motor and the mirror. Optionally, the at least two coupling states comprise at least one engaged state and a disengaged state. In the at least one engaged state, the coupling apparatus provides a coupling force that enables the piezoelectric motor to relatively efficiently control motion and positioning of the mirror. In the disengaged state, the coupling apparatus applies a reduced force to the motor vibrator that enables the mirror to be relatively easily moved by hand and/or by a motor other than the piezoelectric motor without generating possibly damaging stress to the piezoelectric motor. In accordance with an embodiment of the invention, the reduced force is sufficient to maintain contact between the motor coupling surface and the contact surface of the moveable mirror.

An aspect of some embodiments of the invention relates to providing a reflex action device (RAD) comprising a piezoelectric motor controllable to move a moveable body to a first position from which first position the moveable body reflexively moves to a second position when the motor is disengaged from the element. The motor is coupled to the moveable body by a coupling apparatus controllable to provide different magnitudes of resilient force for coupling the motor to the element and is controlled to reduce the resilient force to disengage the motor and enable reflexive return of the element to the second position.

According to an aspect of some embodiments of the invention, the RAD is configured so that when the piezoelectric motor moves the element to the first position, it operates to "store" potential energy for moving the element to a second position. The potential energy is released to move the moveable body to the second position by controlling the coupling apparatus to disengage the piezoelectric motor from the moveable body.

According to an aspect of some embodiments of the invention, the potential energy comprises electromagnetic potential energy. Optionally, the electromagnetic energy is stored in a capacitor.

According to an aspect of some embodiments of the invention, the potential energy comprises mechanical potential energy. Optionally, the potential energy comprises gravitational potential energy. Optionally, the mechanical energy comprises potential energy stored in an elastic body.

For convenience of presentation, a first position is referred to as an "active position" and the second position to which the moveable body reflexively returns is referred to as a "default position".

In an embodiment of the invention the RAD device comprises a lock, also referred to as a "RAD lock" and the moveable body is a locking element, hereinafter referred to as a "bolt", for which in at least one of the first and second positions the bolt engages a catch that locks the lock. For convenience of presentation, it is assumed that the second position is the default position and in the default position the bolt locks the lock.

In an embodiment of the invention, the coupling apparatus comprises a component, hereinafter a "shape memory component" that is used to control the coupling force provided by the coupling apparatus.

The shape memory component is formed from a shape memory material that can be configured with at least one "remembered shape". The shape memory material has a first phase in which it is relatively easily deformed and a second phase in which it tends to maintain a remembered shape and is not easily deformed. If in the first phase, the material is deformed to a shape other than the remembered shape, the material can generally be returned to its remembered shape by controlling the material temperature to transform the material to its second phase. In transforming to the second phase and the remembered shape, the material will resist relatively large forces that operate to prevent the material from assuming its remembered shape.

In accordance with an embodiment of the invention, a coupling force applied by the coupling apparatus to engage the piezoelectric motor to the moveable body is a function of the shape and/or phase of the shape memory component. The force is different when the shape memory component is in the first relatively malleable phase than when it is in its second phase in which it "forcefully" tends to assume and maintain its remembered shape. Controlling the temperature of the shape memory component controls the phase and/or shape of the component and thereby the coupling force provided by the coupling component. Optionally, the shape memory material is a shape memory alloy (SMA). Optionally, the shape memory material is a shape memory polymer.

For convenience of presentation, the shape memory material is assumed to be an SMA, such as for example any of the conventional SMA alloys of Ni—Ti, Cu—Zn-A or Cu—Al—Ni. An SMA alloy has a first phase referred to as a martensite phase, in which it is relatively easily plastically deformed, and a second phase referred to as an austenite phase, in which it is not easily deformed. The alloy may be transformed from the martensite phase to the austenite phase by raising the alloy temperature above a transformation temperature (TTR). The alloy can subsequently be returned to the martensite phase by lowering the temperature below the TTR. The transformation temperature is sensitive to the alloy composition and can generally be determined to be a temperature in a range between about −150° C. and about +150° C.

An object made from an SMA can be programmed using any of various suitable heating processes known in the art with a shape, i.e. a remembered shape that it assumes in the austenite phase. In the martensite phase the object can generally be relatively easily plastically deformed and will not maintain its shape when stressed by relatively moderate force. In the martensite phase if the object is deformed to a shape other than the remembered shape and then heated to the austenite phase, the object will exhibit shape memory and revert to, and maintain in the austenite phase, the remembered shape. The transition to the remembered shape will generally occur and the remembered shape maintained "aggressively", even if opposed by a relatively large force.

In some embodiments of the invention, the coupling apparatus is configured to normally provide a coupling force that maintains the piezoelectric motor engaged with the moveable body in an engaged state of the at least one engaged state. When the at least one shape memory component undergoes a phase change from martensite to austenite, or alternatively from austenite to martensite, the coupling apparatus reduces the coupling force and optionally disengages the motor from the moveable body.

In some embodiments of the invention, the coupling apparatus is configured to normally provide a relatively small coupling force that maintains the piezoelectric motor disengaged. When the at least one shape memory component undergoes a phase change from martensite to austenite or, alternatively from austenite to martensite, the coupling apparatus increases the coupling force and optionally changes the state of the motor to an engaged state.

In an embodiment of the invention, the coupling apparatus comprises at least one resilient component, such as a spring, that provides a resilient force for coupling the motor to the body. The at least one spring is coupled to at least one shape memory component whose shape is controllable to control a length to which at least a portion of the at least one spring extends and thereby the coupling force provided by the spring. Optionally, the spring is a coil spring. Optionally, the spring is a leaf spring. In an embodiment of the invention, the shape memory component is a shape memory wire whose length is controlled to control extension of the spring by controlling temperature of the wire.

In some embodiments of the invention, the shape memory component is a spring formed from a shape memory material and the transformation temperature is determined to be a temperature below an operating temperature of the piezoelectric motor. The spring is therefore normally in an austenite phase when the motor is engaged to the moveable body, and the spring provides at least a portion of the coupling force that engages the motor to the moveable body.

To disengage the motor from the moveable body, the temperature of the spring is lowered to below the transition temperature and the spring transformed to a martensite phase. In the martensite phase, the spring is relatively easily plastically deformed and does not substantially provide force that contributes to coupling the motor to the moveable body. Therefore, when the spring is transformed to the martensite phase, force pressing the coupling surface of the motor to the movable body is reduced and the motor disengaged.

In some embodiments of the invention, the transformation temperature of the SMA from which the spring is formed is determined to be a temperature greater than an ambient temperature when the motor is not operating. Optionally, the transformation temperature is less than an operating temperature of the piezoelectric motor. When the motor is not operating, the spring is therefore normally in a martensite phase, in which phase the spring is easily plastically deformed, does not contribute substantially to force coupling the piezoelectric motor to the moveable body and the motor is therefore in a disengaged state.

To change the state of the motor to an engaged state in which the coupling force is increased so that the motor is controllable to appropriately control motion and position of the moveable body, the temperature of the spring is increased to at least the transformation temperature to change the phase of the spring to the austenite phase. In the austenite phase the spring assumes a remembered shape in which it contributes sufficient force to the coupling force to engage the motor.

There is therefore provided in accordance with an embodiment of the invention, a mirror system comprising: a mirror; at least one piezoelectric motor having a coupling surface for coupling the motor to a moveable body; at least one spherical contact surface coupled to the mirror; and a motor mounting frame that holds a piezoelectric motor of the at least one piezoelectric motor and presses the piezoelectric motor coupling surface to a contact surface of the spherical contact surface; wherein the motor is controllable to apply force to the contact surface that rotates the mirror. Optionally, the spherical contact surface comprises a surface of a truncated sphere having a facet to which the mirror is fixed.

Optionally, the at least one piezoelectric motor comprises a first piezoelectric motor controllable to rotate the sphere about an axis through the center of the sphere and a second piezoelectric motor controllable to rotate first motor to rotate thereby the axis about which the first piezoelectric motor rotates the sphere. Alternatively, the at least one motor optionally comprises a first piezoelectric motor coupled to the sphere controllable to rotate the sphere selectively about first and second orthogonal axes of rotation that pass through the center of the sphere.

In some embodiments of the invention, the at least one motor comprises first and second motors. Optionally, the at least one coupling surface comprises first and second contact surfaces to which the contact surfaces of the first and second piezoelectric motors are respectively pressed. Optionally the mirror system comprises a mirror mount having a first surface to which the mirror is mounted and at least one second surface to which the first and second contact surfaces are mounted. Optionally, the first and second contact surfaces have a same center of curvature. Additionally or alternatively, the first and second contact surfaces have a same radius of curvature.

In some embodiments of the invention, the first motor is controllable to apply force to the first contact surface that rotates the mirror about a first axis and the second motor is controllable to apply force to the second contact surface that rotates the mirror about a second axis substantially orthogonal to the first axis.

In some embodiments of the invention, the mirror system comprises a motor mount that fits inside the mirror mount and comprises first and second motor mounting frames that hold the first and second motors. Optionally the mirror system comprises a ball joint that couples the motor mount to the mirror mount.

In some embodiments of the invention, the motor mounting frame comprises a coupling apparatus controllable to selectively provide different coupling forces for coupling the coupling surface of the piezoelectric motor to the contact surface. Optionally the coupling apparatus is controllable to determine coupling force magnitude to selectively engage the motor to, or disengage the motor from, the contact surface.

BRIEF DESCRIPTION OF FIGURES

Embodiments of the invention will be more clearly understood by reference to the following description of embodiments thereof read in conjunction with the figures attached hereto. In the figures, identical structures, elements or parts that appear in more than one figure are generally labeled with a same numeral in all the figures in which they appear. Dimensions of components and features shown in the figures are chosen for convenience and clarity of presentation and are not necessarily shown to scale. The figures are listed below.

FIGS. 7A and 7B schematically show exploded perspective views from different directions of a mirror system comprising a mirror whose orientation is controllable by two piezoelectric motors, in accordance with an embodiment of the invention;

DETAILED DESCRIPTION OF EXEMPLARY EMBODIMENTS

Figure 1:
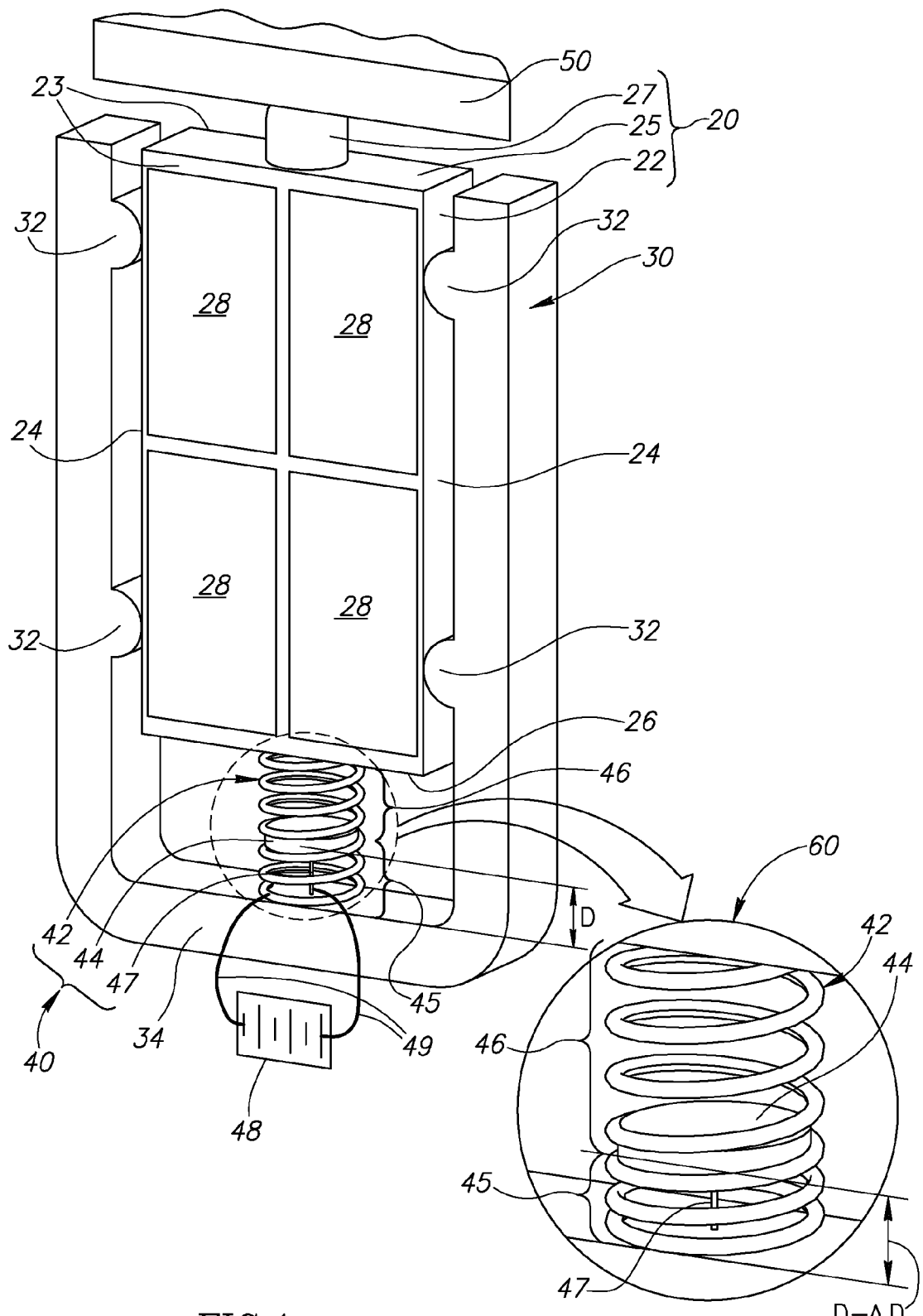
FIG. 1 schematically shows a piezoelectric motor having a coupling apparatus controlled by a shape memory alloy control wire to provide different coupling forces for coupling the motor to a moveable body, in accordance with an embodiment of the invention.

FIG. 1 schematically shows a piezoelectric motor 20 mounted to a motor mounting frame 30 comprising a coupling apparatus 40 controllable to provide different coupling forces for coupling the motor to a moveable body 50, only a part of which is shown, in accordance with an embodiment of the present invention.

Piezoelectric motor 20 is, for example, of a type described in above referenced U.S. Pat. No. 5,453,653. The motor comprises a thin rectangular ceramic piezoelectric vibrator 22 having front and back planar face surfaces 23, of which only an edge of back surface 23 is seen in the perspective of the figure, relatively long edge surfaces 24 and relatively short top and bottom edge surfaces 25 and 26 respectively. A friction nub 27 for coupling motor 20 to body 50 is bonded to top edge surface 25. Optionally, four quadrant electrodes 28 are located in a symmetric checkerboard pattern on front face surface 23. A single large electrode (not shown) is located on back surface 23. Vibrations in piezoelectric motor 20 are excited by electrifying quadrant electrodes 28 relative to the large electrode using any of various voltage configurations as is known in the art. The vibrations are controllable to generate vibratory motion in friction nub 27 that control motion and positioning of body 50.

Mounting frame 30 grasps and holds piezoelectric motor 20 using any devices and methods known in the art. By way of example, mounting frame 30 is U shaped and has grasping tines 32 that press against long edge surfaces 24 of piezoelectric vibrator 22 to secure the vibrator in the frame. Optionally, frame 30 is shaped and formed from a sufficiently elastic material so that tines 32 press against edges 24 with resilient force. Optionally, tines 32 press against the long edges at regions of the edges that are nodal regions of the vibrator at an operating frequency of the vibrator. In some embodiments of the invention, frame 30 is formed from a resilient plastic.

Coupling apparatus 40 is located on a base bar 34 of frame 30 and optionally comprises a biasing coil spring 42 that presses on bottom edge surface 26 of piezoelectric motor 20 to resiliently press the motor's friction nub 27 to body 50. Biasing spring 42 is optionally secured to base bar 34 and optionally has an anchor plate 44 fixed to a coil or coils of the spring at a distance "D" from the base that divides biasing spring 42 into lower and upper portions 45 and 46 respectively.

Anchor plate 44 is connected to a shape memory alloy (SMA) control wire 47 that extends from the anchor plate and is optionally tethered to base bar 34. SMA control wire 47 is connected to a power supply 48 controllable to generate current in the SMA control wire sufficient to heat the wire and raise its temperature above a transformation temperature of the wire at which transformation temperature the wire changes from a martensite phase to an austenite phase. Optionally, anchor plate 44, and biasing spring 42 are conductors and power supply 48 is connected to biasing spring 42 to complete a current path for current that the power supply generates in SMA control wire 47. In FIG. 1, power supply 48 is schematically shown connected to SMA control wire 47 and spring by wires 49.

In an embodiment of the invention, SMA control wire 47 has a transition temperature from martensite to austenite that is greater than an ambient temperature of the motor during motor operation. Normally, SMA control wire 47 is therefore in the martensite phase, is relatively pliable and substantially does not apply force to anchor plate 44, nor therefore substantially affect a coupling force that biasing spring 42 applies to bottom edge surface 26. However, in accordance with an embodiment of the invention, SMA control wire 47 is programmed with a remembered shape that causes it to contract and assume a shortened length when power supply 48 heats the SMA wire to a temperature above its transformation temperature and the wire changes phase to austenite. When the SMA control wire contracts, it pulls anchor plate 44 down towards base bar 34 and shortens distance D at which the anchor plate is displaced from the base bar by a distance ΔD. As a result of the reduction in distance D, lower spring portion 45 of biasing spring 42 contracts and upper spring portion 46 extends, reducing force that the biasing spring applies to bottom edge 26 of vibrator 22. Inset 60 schematically shows power supply 48 controlled to generate current in SMA control wire 47 that shortens the wire and thereby bottom wire portion 45 and reduces force that the biasing spring applies to bottom edge surface 26.

In accordance with an embodiment of the invention, D, and the characteristics of biasing spring 42 are determined so that when SMA control wire 47 is in the martensite phase and does not substantially affect the biasing spring, the biasing spring presses on bottom surface 26 with sufficient force so that the motor is in an engaged state and can effectively control motion of body 50. In addition, D, ΔD and the characteristics of biasing spring 42 are determined so that when the spring is shortened by SMA control wire 47, friction nub 27 remains in contact with moveable body 50 but the motor is effectively disengaged from the body. With the motor disengaged, moveable body 50 may be moved by hand and/or by a motor other than piezoelectric motor 20 without generating possibly damaging stress on the piezoelectric motor and without the piezoelectric motor substantially resisting the motion generated manually or by the other motor.

It is noted that for coupling apparatus 40 the transformation temperature for SMA control wire 47 is above the ambient temperature in which piezoelectric motor 20 is expected to operate. The motor is normally engaged and the control wire is heated to disengage the motor. In some embodiments of the invention, the transformation temperature of SMA control wire 47 is lower than the ambient temperature and the control wire is normally in its remembered "shortened" austenite phase shape as shown in inset 60 and motor 20 is normally disengaged. To engage the motor 20, control wire 47 is cooled to a temperature equal to or less than the transformation temperature, which causes control wire 47 to phase change to its malleable martensite phase. In the martensite phase, control wire 47 does not apply sufficient force on anchor plate 44 to maintain lower spring portion compressed, the lower spring portion is released, and spring 42 assumes the configuration shown to the left of inset 60 and coupling apparatus 40 engages motor 20. Control wire 47 is cooled using any suitable method known in the art and is optionally cooled using a Peltier element that is thermal coupled to the wire.

Figure 2A:
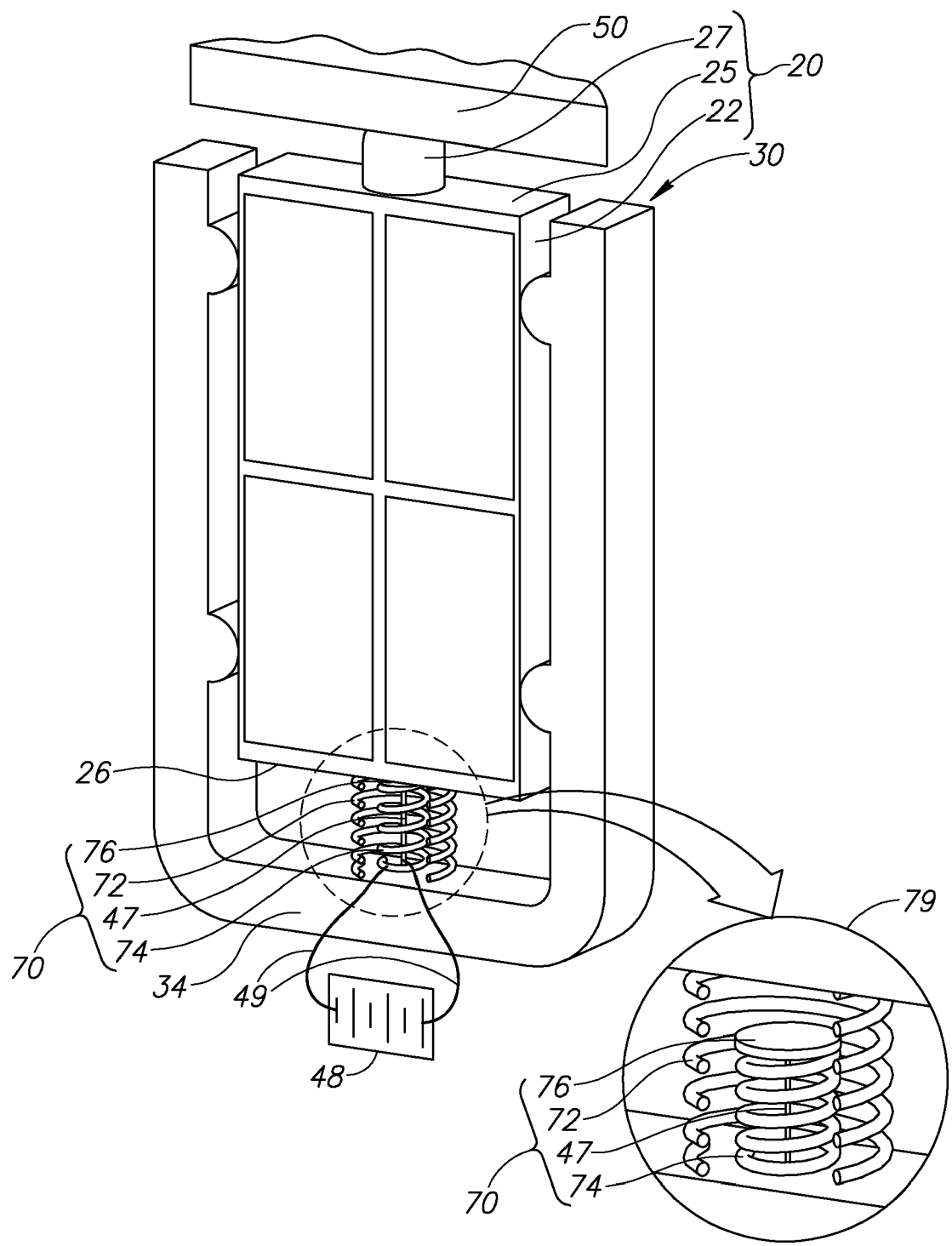
FIG. 2A schematically shows a different coupling apparatus comprising a shape memory alloy control wire, in accordance with an embodiment of the invention.

FIG. 2A schematically shows a coupling apparatus 70, in accordance with an embodiment of the invention. Coupling apparatus 70 is shown by way of example comprised in a motor frame 30 similar to that shown in FIG. 1 and providing coupling force to motor 20.

Coupling apparatus 70 optionally comprises a biasing coil spring 72, shown cutaway, that provides a coupling force for piezoelectric motor 20 and an auxiliary coil spring 74 inside and substantially concentric with the biasing spring. Auxiliary spring 74 has an anchor plate 76, optionally at an end of the spring that presses against bottom edge surface 26 of piezoelectric motor 20. A control SMA wire 47 is anchored to the anchor plate and tethered to base bar 34. Control SMA wire 47 is electrically connected to power supply 48, which is controllable to generate current in the SMA control wire to heat the control wire to a temperature above its transition temperature and cause the wire to undergo a phase change from martensite to austenite that shortens the wire.

As in the case of SMA control wire 47 shown in FIG. 1, in FIG. 2 control wire 47 is normally in the martensite phase during operation of piezoelectric motor 20 and does not substantially affect the force that auxiliary spring 74 applies to bottom edge surface 26 of the motor. As a result, during normal operation of piezoelectric motor 20 the motor is engaged to a moveable body, e.g. body 50, by a coupling force to which both biasing spring 72 and auxiliary spring 74 contribute. In the austenite phase, shown in an inset 79, auxiliary spring 74 configures in a shortened, remembered shape and pulls anchor plate 76 towards base bar 34 to reduce substantially to zero, force that the auxiliary spring applies to bottom edge surface 26 of piezoelectric vibrator 22. The total coupling force that coupling apparatus 70 provides for coupling motor 20 to moveable body 50 is thereby reduced. Optionally, the reduction in coupling force is sufficient to disengage piezoelectric motor 20 from the moveable body.

Similarly to the case of coupling apparatus 40 shown in FIG. 1, a coupling apparatus in accordance with an embodiment of the invention similar to coupling apparatus 70 has a control wire 47 characterized by a transformation temperature less than an ambient temperature of an environment in which motor 20 is expected to operate. The coupling apparatus is normally in a state shown in inset 79 and motor 20 disengaged. To engage the motor control wire 47 is cooled, optionally using a Peltier element to release inner spring 74.

Figure 2B:
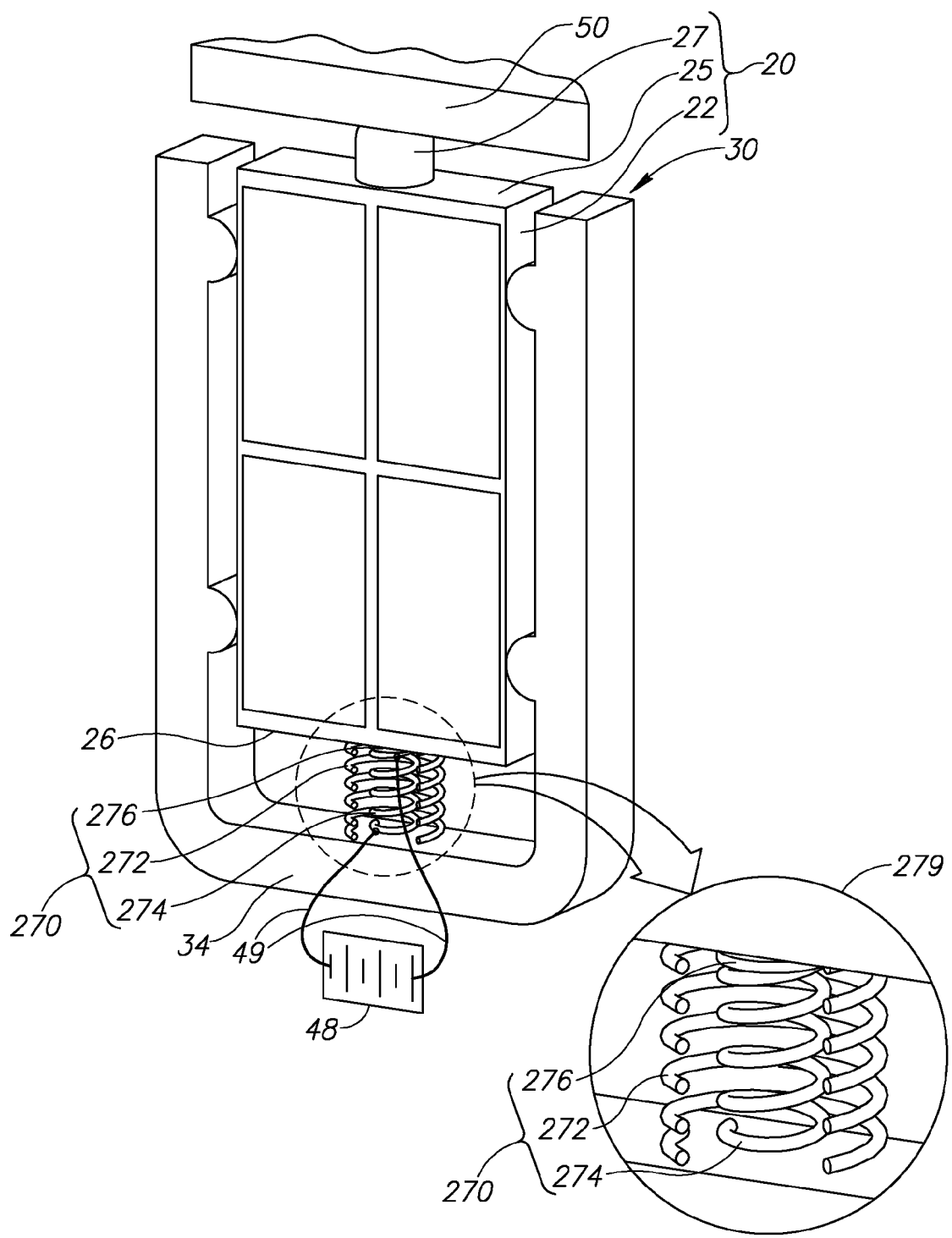
FIG. 2B schematically shows a coupling apparatus similar to that shown in FIG. 2A but comprising a shape memory alloy coil spring rather than a control wire for controlling coupling force, in accordance with an embodiment of the invention.

FIG. 2B schematically shows another embodiment of a coupling apparatus, coupling apparatus 270 comprising outer and inner concentric springs 272 and 274 respectively, in accordance with an embodiment of the invention. For convenience of presentation, inset 279 shows an enlarged view of coupling apparatus 270 and its components.

Optionally, inner spring 274 is a spring formed at least partially from an SMA material and is connected to power supply 48 so that the power supply can be controlled to generate current in the inner spring. The SMA material from which inner spring is formed has a transformation temperature greater than an ambient temperature of an environment in which motor 20 is expected to be operating and, optionally, less than an operating temperature of the motor. At the ambient temperature, inner spring 274 is therefore in a relatively malleable, martensite phase and does not contribute substantially to a coupling force provided by coupling apparatus 270. Outer spring 272 is configured to provide sufficient force to edge surface 26 to maintain friction nub 27 in contact with moveable body 50 but not sufficient force to engage motor 20 with body 50 when inner spring 274 is in the martensite phase.

To engage motor 20 to body 50, power supply 48 is controlled to generate current in inner spring 274 to heat the spring to at least its transformation temperature and cause the spring to assume a remembered shape in which it presses on bottom edge surface 26 with sufficient force to engage the motor with body 50. In an embodiment of the invention, after being engaged and turned on, assuming that the operating temperature of the motor is above the transformation temperature, heat generated from operation of the motor contributes at least in part to maintaining spring 274 in the austenite phase, and current provided by power supply 48 to inner spring 274 may be reduced or turned off. The motor remains engaged with power supply 48 providing reduced or substantially no current in the spring. When power supply 48 is controlled to stop the current it generates in inner spring 274 and as a result the motor is turned off, the temperature of the spring drops below the transformation temperature and the inner spring reverts to its martensite state and disengages piezoelectric motor 20 from body 50.

In some embodiments of the invention, motor 20 is "self engaging". The motor is turned on and heat from the motor is relied upon to heat inner spring 274 to its transition temperature and engage the motor with body 50.

It is noted, that whereas coupling apparatus 70 shown in FIG. 2A is activated to disengage a piezoelectric motor from a moveable body, coupling apparatus 270 is activated to engage a piezoelectric motor to a moveable body.

Figure 3A:
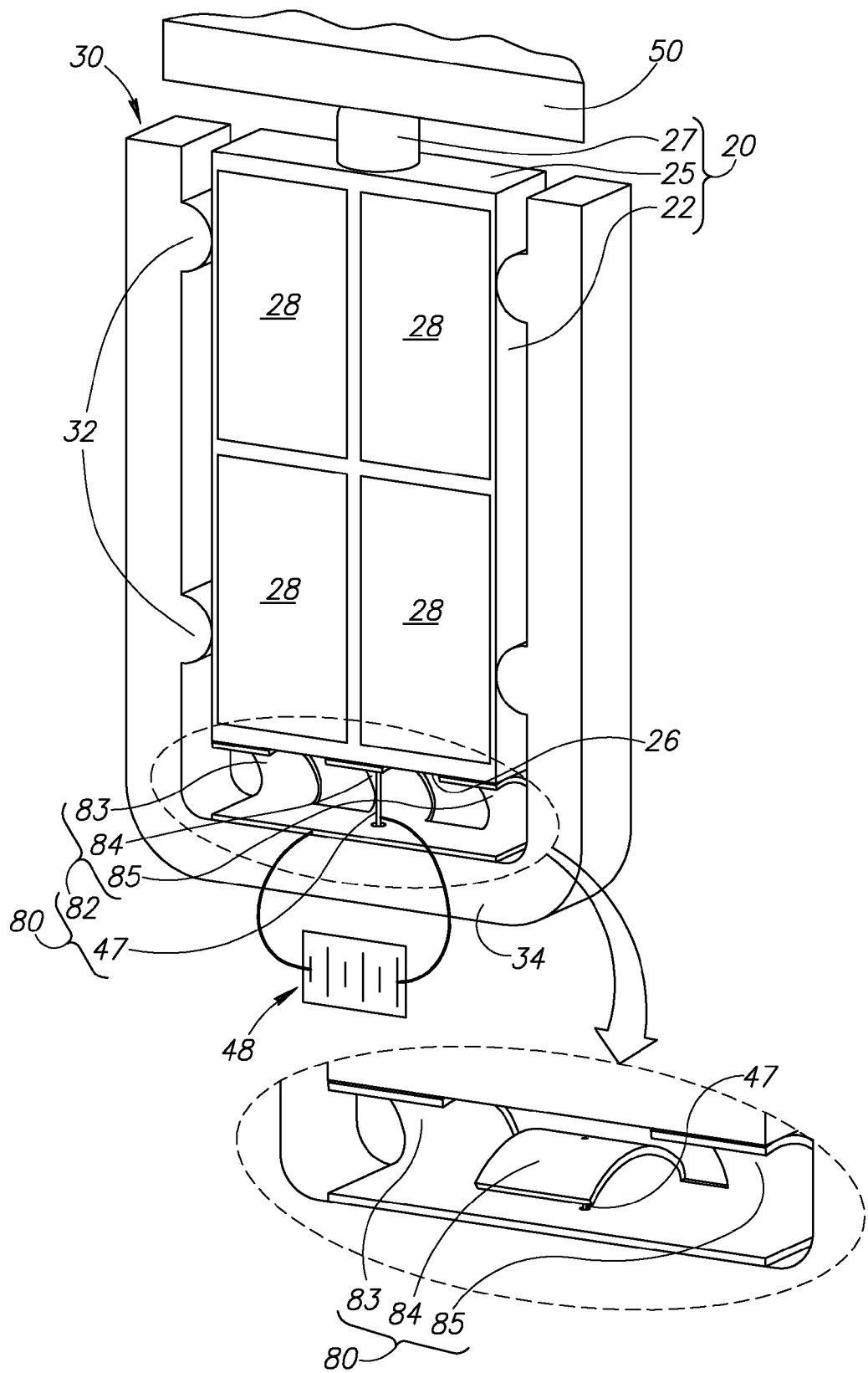
FIG. 3A schematically shows a coupling apparatus comprising a leaf spring operable to provide different coupling forces for coupling a piezoelectric motor to a moveable body, in accordance with an embodiment of the invention.

FIG. 3A schematically shows a coupling apparatus 80, in accordance with an embodiment of the invention. As in FIGS. 1 and 2, coupling apparatus 80 is mounted to a motor mounting frame similar to motor frame 30 and is shown providing coupling force for coupling motor 20 to moveable body 50.

Coupling apparatus 80 comprises a leaf spring 82 comprising a plurality of leafs, each independently pressing against bottom surface 26 of vibrator 22. By way of example, leaf spring 82 comprises three leafs 83, 84, and 85. At least one leaf, by way of example leaf 84, is connected to an SMA control wire 47 that can be controlled by power supply 48 to undergo phase change to an austenite phase in which phase the control wire is shortened. When shortened, leaf 84 is pulled down and the leaf stops pressing on bottom edge surface 26, thereby reducing a coupling force that leaf spring 82 and thereby coupling apparatus 80 applies to piezoelectric motor 20. Optionally, when leaf 84 is pulled away from bottom edge surface 26, piezoelectric motor 20 is disengaged from moveable body 50.

It is noted that a coupling apparatus in accordance with an embodiment of the invention comprising a leaf spring similar to leaf spring 82 having a plurality of leafs may be configured and operated to provide a plurality of different coupling forces and therefore a plurality of different states in which motor 20 is engaged to a moveable body, e.g. body 50. For example, each leaf of leaf spring 82 may be connected to a different SMA control wire so that each leaf can be controlled to press or not press on bottom edge surface 26 independently of whether another leaf presses or does not press on the bottom surface. By controlling different configurations of leaves to press against bottom edge surface 26, the leaf spring can engage motor 20 to moveable body 50 with a plurality of different coupling forces.

In accordance with an embodiment of the invention, controlling the coupling force provided by the coupling apparatus to engage the piezoelectric motor to a moveable body is used to control an amount of time that a coupling surface, such as optionally a friction nub, of a piezoelectric motor contacts a moveable body during each vibration cycle of the coupling surface. The greater the coupling force, the longer is the contact time of the coupling surface with the contact surface of the moveable body per vibration cycle of the coupling surface. Controlling the contact time controls a time average of force that the piezoelectric motor applies to the moveable body and therefore acceleration and motion of the body.

It is further noted that a coupling apparatus in accordance with an embodiment of the invention, other than apparatus similar to coupling apparatus 80 may be configured to provide a plurality of different coupling forces. For example, a coupling apparatus having a biasing spring similar to biasing spring 42 schematically shown in FIG. 1 may comprise, in accordance with an embodiment of the invention, a plurality of anchor plates 44, each connected to a different SMA wire and located at different distances from base bar 34. By shortening different numbers of the SMA control wires, the biasing spring is controlled to provide different coupling forces.

Figure 3B:
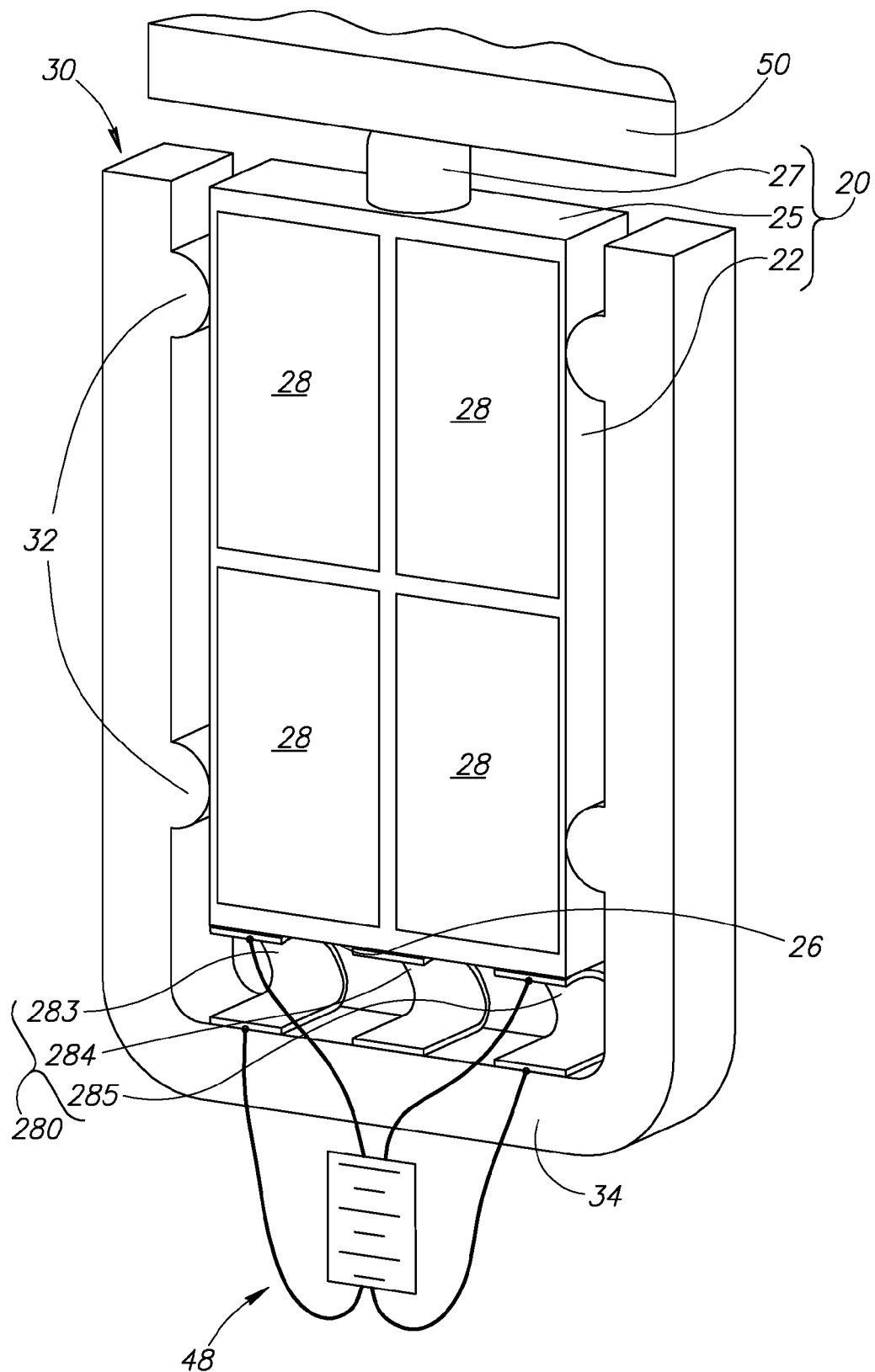
FIG. 3B schematically shows another coupling apparatus comprising a leaf spring, in accordance with an embodiment of the invention.

FIG. 3B schematically shows a coupling apparatus 280, in accordance with an embodiment of the invention.

Coupling apparatus 280 optionally comprises a central leaf spring 284 and two lateral leaf springs 283 and 285. Lateral leaf springs 283 and 285 are optionally formed from an SMA material and have transformation temperatures that are greater than an ambient temperature of an environment in which piezoelectric motor 20 is expected to operate and are optionally less than an operating temperature of the motor. Central leaf spring 284 applies sufficient force to bottom surface 26 to maintain motor 20 disengaged from body 50 but with friction nub 27 contacting the body. Motor 20 is engaged to body 50 by controlling power supply 48 to generate current selectively in leaf 283 and/or leaf 285 to heat the leaf or leaves to at least their respective transformation temperatures so that the leaf or leafs assume their remembered shape or shapes and press on bottom surface 26. Selectively heating one or the other of leaves 283 and 285, or both of the leaves provides different possible coupling forces for engaging motor 20 with body 50.

Figure 3C:
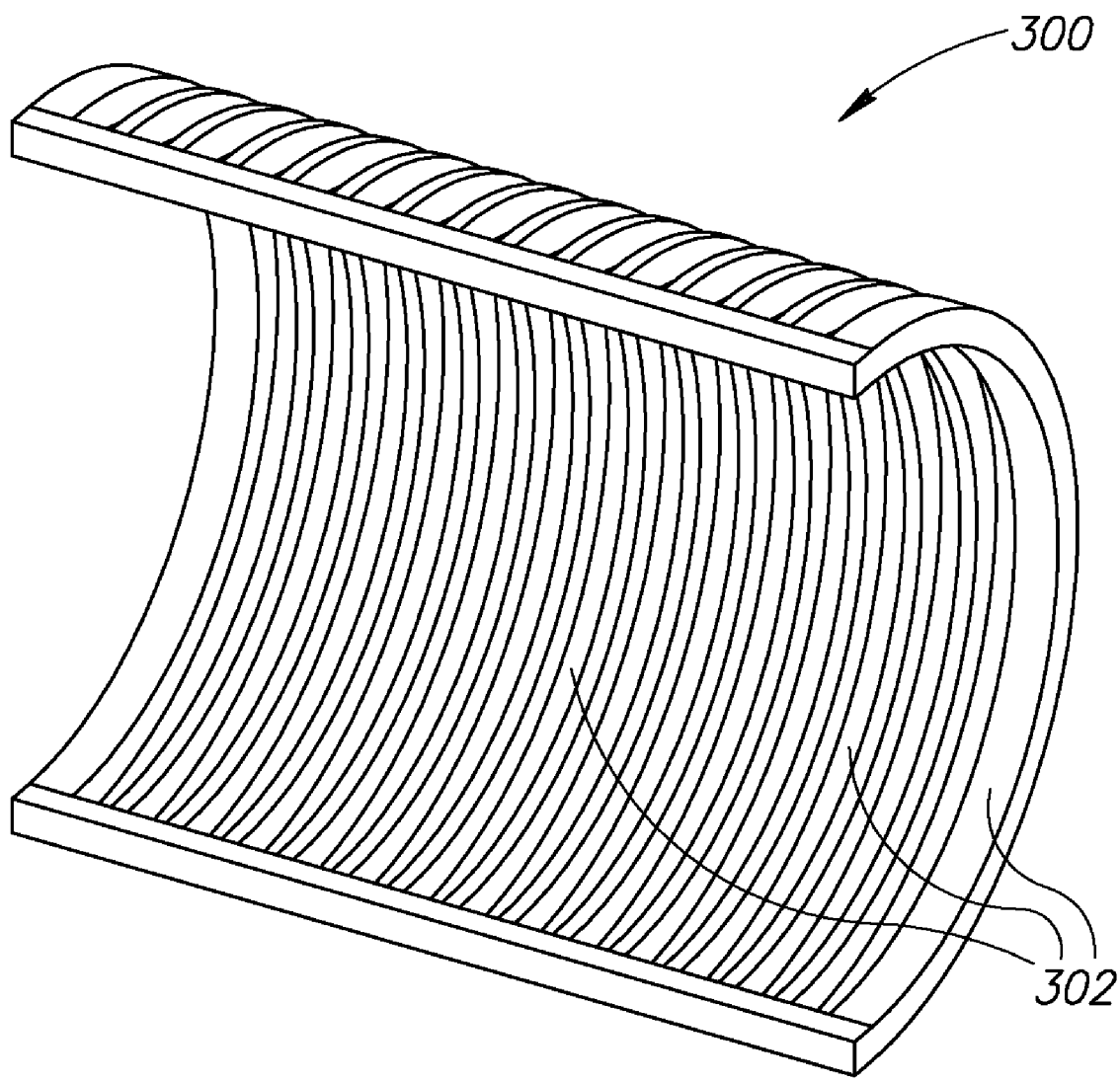
FIG. 3C schematically shows a variation of a leaf spring operable to provide different coupling forces for coupling a piezoelectric motor to a moveable body, in accordance with an embodiment of the invention.

Whereas, each leaf spring 283 and 284 shown in FIG. 3B is shown as a single solid leaf, in some embodiments of the invention, leaf springs having a given overall external envelope shape are formed having a plurality of relatively thin, component strips, such as a spring 300 shown in FIG. 3C. Whereas spring 300 has an overall external shape similar to springs 283 and 285, spring 300 is formed comprising a plurality of component strips 302. For a given size and external envelope, a leaf spring formed having individual component strips is generally more energy efficient and more easily conditioned to remember a desired shape than a spring having the same envelope shape formed as a single solid piece.

Figure 4:
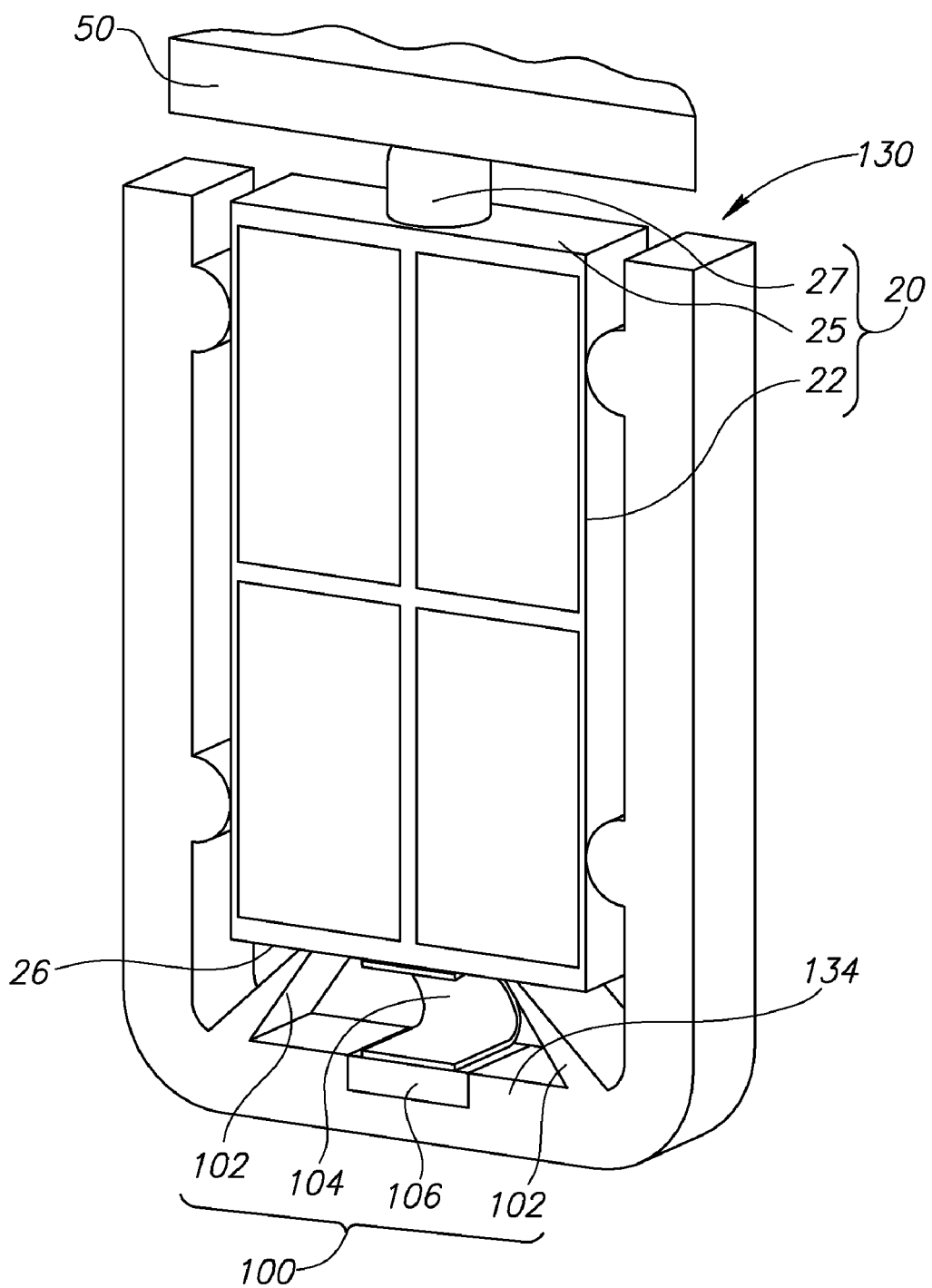
FIG. 4 schematically shows a coupling apparatus comprising a shape memory component that is cooled to provide different coupling forces for coupling a piezoelectric motor to a moveable body, in accordance with an embodiment of the invention.

FIG. 4 schematically shows a coupling apparatus 100, in accordance with an embodiment of the invention.

Coupling apparatus 100 is optionally comprised in a motor mounting frame 130 and optionally comprises elastic biasing fingers 102 that are integrally formed with the motor frame and provide a coupling force to engage piezoelectric motor 20 to moveable body 50. Optionally, motor frame 130 is injection molded from a suitable plastic. Coupling apparatus 100 additionally comprises a leaf spring 104 formed from an SMA material that is mounted to base bar 134 of frame 130 and is thermally coupled to a cooling device, optionally a Peltier thermoelectric element 106, optionally positioned in the base bar.

The transformation temperature of leaf spring 104 is below the normal ambient temperature of an environment in which piezoelectric motor 20 is expected to operate. As a result, normally, leaf spring 104 is in an austenite phase. In the austenite phase the leaf spring assumes, and aggressively maintains, a remembered shape shown in FIG. 4, presses against bottom edge surface 26 of vibrator 22 and contributes to the coupling force that engages motor 20 to moveable body 50. In accordance with an embodiment of the invention, Peltier element 106 is controlled to cool leaf spring 104 to a temperature below its transformation temperature to cause the leaf spring to undergo phase change to the martensite phase. In the martensite phase, leaf spring 104 becomes pliable and does not apply force to bottom edge surface 26 of vibrator 22, thereby reducing the net coupling force that presses friction nub 27 to body 50 and disengaging piezoelectric motor 20 from the body.

Whereas in the above description of embodiments of the invention, a shape memory component is described as having a single remembered shape, some shape memory components can be trained to exhibit two-way shape memory and have two remembered shapes, each of which the component maintains stably. Generally, whereas a first remembered shape is an austenite shape, a second remembered shape is a martensite phase shape and the component is switched between the remembered shapes by controlling the temperature of the component. In accordance with an embodiment of the invention, one of the remembered shapes is used to provide a first coupling force for coupling a piezoelectric motor to a moveable body and the other remembered shape is used to provide a second coupling force for coupling the motor to the body. For example, a same leaf spring similar to a leaf spring shown in FIGS. 3A-3C having first and second remembered shapes may be controlled to provide first and second different coupling forces when assuming the first and second remembered shapes respectively. In the first remembered shape, the spring provides coupling force sufficient to maintain a piezoelectric motor disengaged from but in contact with a load and in the second shape a coupling force that engages the motor with the load.

Figure 5A:
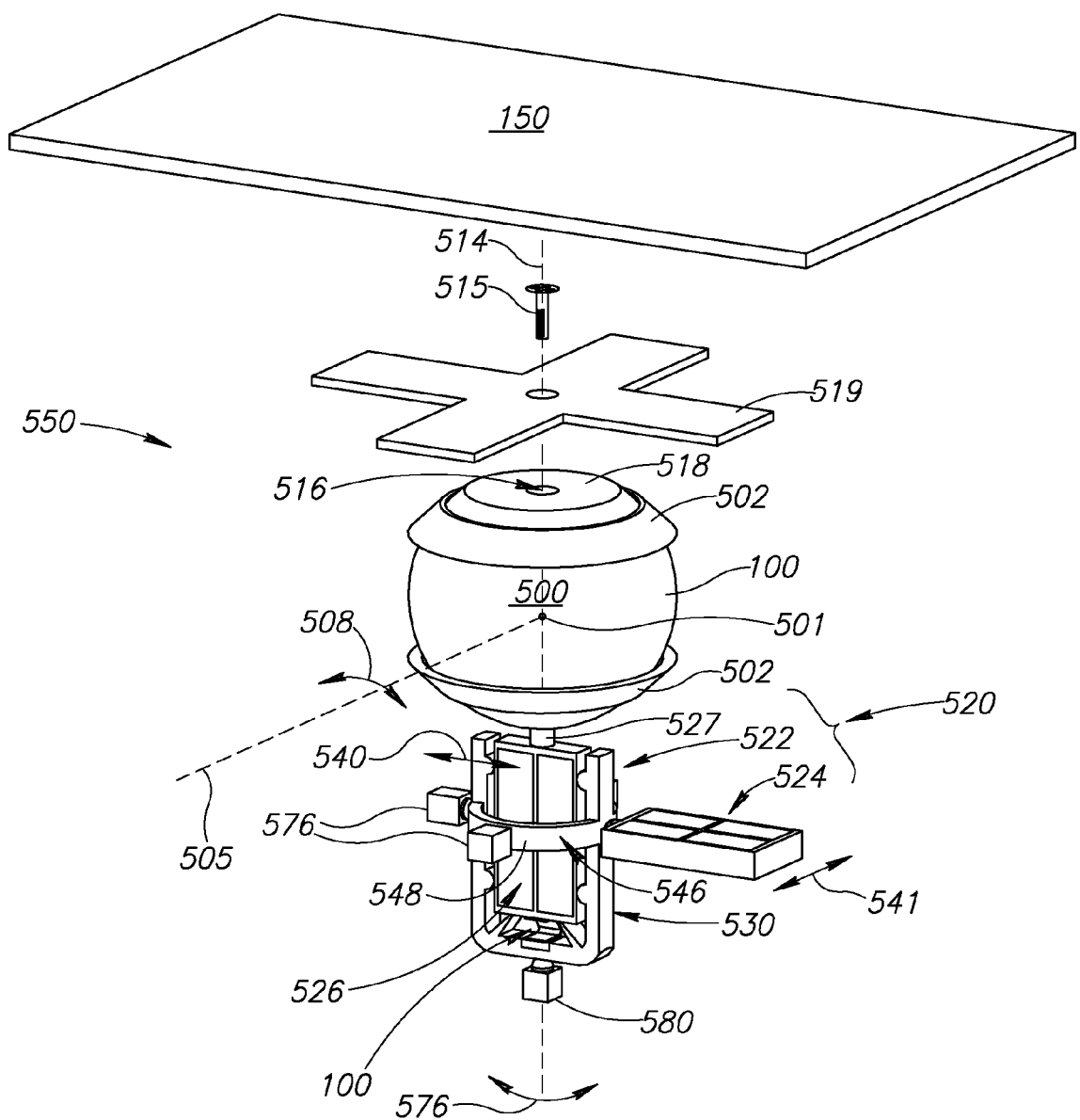
FIG. 5A schematically shows an exploded view of a mirror system comprising a mirror whose orientation is controllable by two piezoelectric motors coupled to the mirror using a coupling apparatus controllable to selectively engage the motors to and disengage the motors from the mirror, in accordance with an embodiment of the invention.
Figure 5B:
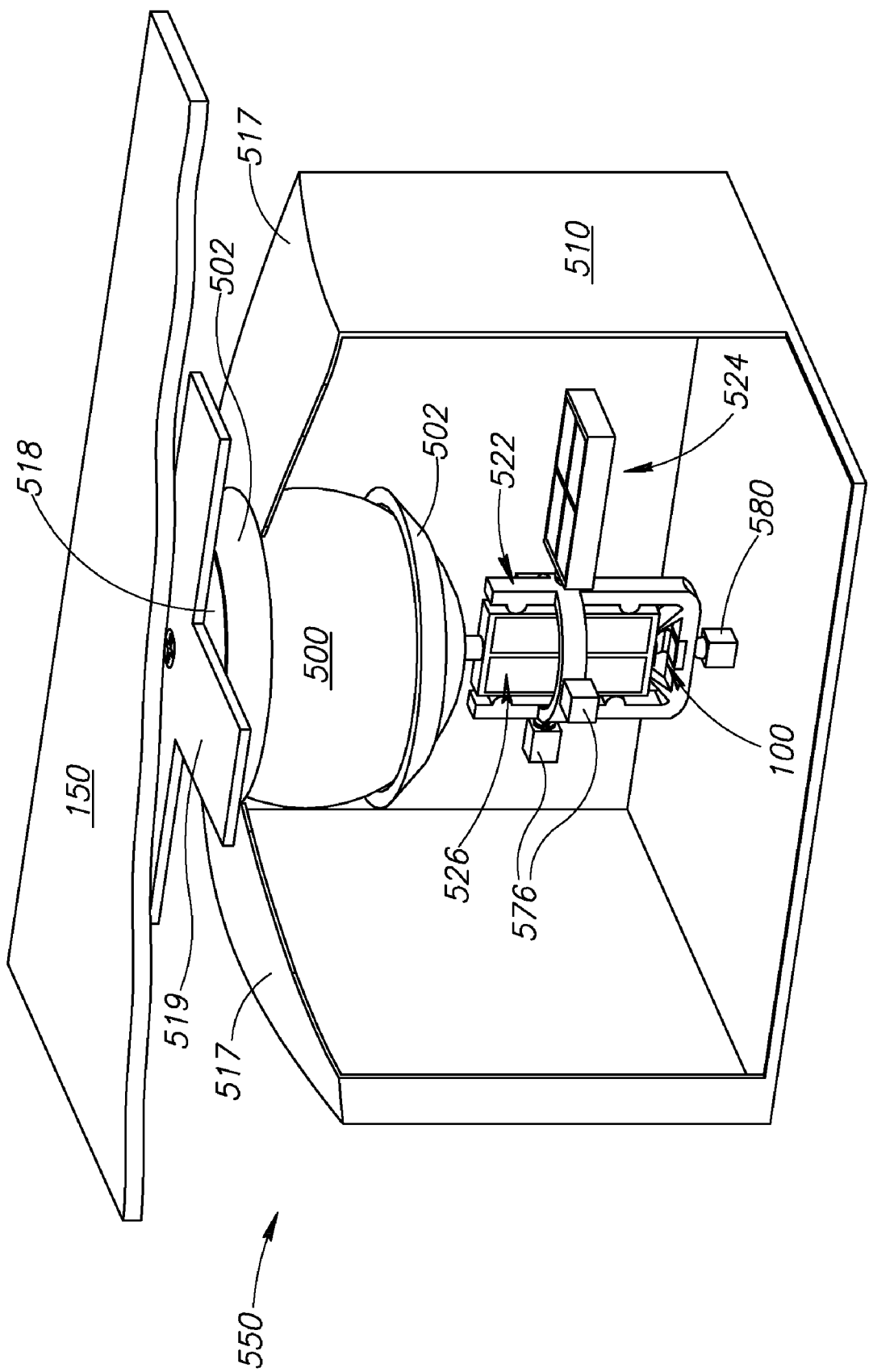
FIG. 5B schematically shows an assembled, partially cut-away view of the mirror system shown in FIG. 5A, in accordance with an embodiment of the invention.

FIG. 5A schematically shows an exploded view of a mirror system 550 comprising a mirror 150 that is rotatable by a multidirectional piezoelectric motor system 520, in accordance with an embodiment of the invention. FIG. 5B schematically shows mirror system 550 assembled and comprising an exemplary housing 510 that provides support for the mirror system and houses the piezoelectric motor system. The housing is partially cutaway to show features of the mirror system.

Mirror 150 is mounted to an optionally cross-shaped bracket 519, which is fixed to a facet 518 of a truncated sphere 500 which is rotated by motor system 520 to orient the mirror in a desired direction. Truncated sphere 500 has an axis 514 perpendicular to facet 518 that passes through the center 501 of the sphere. Optionally, as indicated in FIGS. 5A and 5B, bracket 519 is fixed to facet 518 using at least one bolt 515 that is screwed into a hole 516 formed in sphere 500 that has an axis that coincides with axis 514. Truncated sphere 500 is optionally held between two annular bearing frames 502 each supporting an annular array of spherical bearings (not shown) that allow the sphere to rotate freely about a chosen axis, for example an axis 505 that passes through center 501 of the sphere and is perpendicular to axis 514. Optionally, a ring bearing 502 closest to bracket 519 is mounted to housing 510 (FIG. 5B) so that it protrudes from an external "top" surface 517 of the housing. Optionally, the top surface slopes down with distance from bearing 502 to provide clearance for motion of mirror 150. Whereas sphere 500 is shown being held by two ring bearings 502, other configurations for holding sphere 500 and coupling it to a multidirectional motor, in accordance with an embodiment of the present invention, are possible and can be advantageous. For example, sphere 500 can be supported by three ring bearings in place of two ring bearings 102.

Optionally, motor system 520 is a multidirectional motor system similar to a multidirectional motor system described in U.S. Pat. No. 6,384,515 B1, the disclosure of which is incorporated herein by reference. Multidirectional motor system 520 comprises a driving piezoelectric motor 522 and a steering piezoelectric motor 524. Driving motor 522 is optionally similar to piezoelectric motor 20 (FIG. 4) and comprises a thin rectangular vibrator plate 526 having a friction nub 527 located at a narrow edge surface thereof. Piezoelectric motor 526 is mounted to a motor mounting frame 530 configured to resiliently press friction nub 527 to sphere 500. Optionally, motor mounting frame 530 comprises a coupling apparatus that is controllable to selectively engage and disengage the motor from the sphere. Optionally, the coupling apparatus is a coupling apparatus, such as for example a coupling apparatus similar to coupling apparatus 40 (FIG. 1), 70 (FIG. 2A) or 270 (FIG. 2B), that comprises an SMA component and is controllable to selectively engage and disengage the motor from sphere 500 by controlling the SMA component. By way of example, motor mounting frame 530 comprises coupling apparatus 100 shown in FIG. 4.

Piezoelectric motor 520 is controllable to generate vibrations in friction nub 527 that lie substantially in a plane parallel to the motor vibrator plate 526 and apply force to a surface region of sphere 500 that friction nub 527 contacts. The vibrations are controllable to apply force selectively in either direction indicted by a double arrowhead "action" line 540 that is parallel to the plane of the vibrator plate. The force generates a torque that rotates sphere 500 about an axis 505 that passes through center 501 of sphere 500 and is perpendicular to both action line 540 and axis 514. Rotation of sphere 500 through a given desired angle about axis 505 rotates mirror 150 through the same angle about axis 505 to position the mirror at a desired orientation about axis 505.

Motor mounting frame 530 comprises a circular "rotation" collar 546, that is held at least partly by low friction bearings, such as roller bearings 576, which contact the rotation ring and are suitably mounted to housing 510 (FIG. 5B). Motor mounting frame 530 is supported by at least one bearing 580 optionally mounted to a bottom panel of housing 510. Bearings 576 and 580 enable driving piezoelectric motor 522 to rotate relatively freely about axis 514. Steering motor 524, which is optionally similar to drive motor 522, is coupled to rotation collar 548 and is mounted in housing 510 using any of various methods and devices known in the art. The steering motor is controllable to rotate collar 546 and thereby drive motor 522 to orient the plane of vibration plate 526 of the drive motor and axis 505 in different desired azimuth angles about axis 514.

In accordance with an embodiment of the invention, steering motor 524 and driving motor 522 are controlled respectively to orient axis 505 at a desired azimuth angle and rotate mirror 150 through a desired angle about axis 505 to orient mirror 150 in a desired direction. In accordance with an embodiment of the invention, coupling apparatus 100 is controlled to disengage motor 522 from truncated sphere 500 to enable relatively easy manual adjustment of the orientation of mirror 150.

Figure 6:
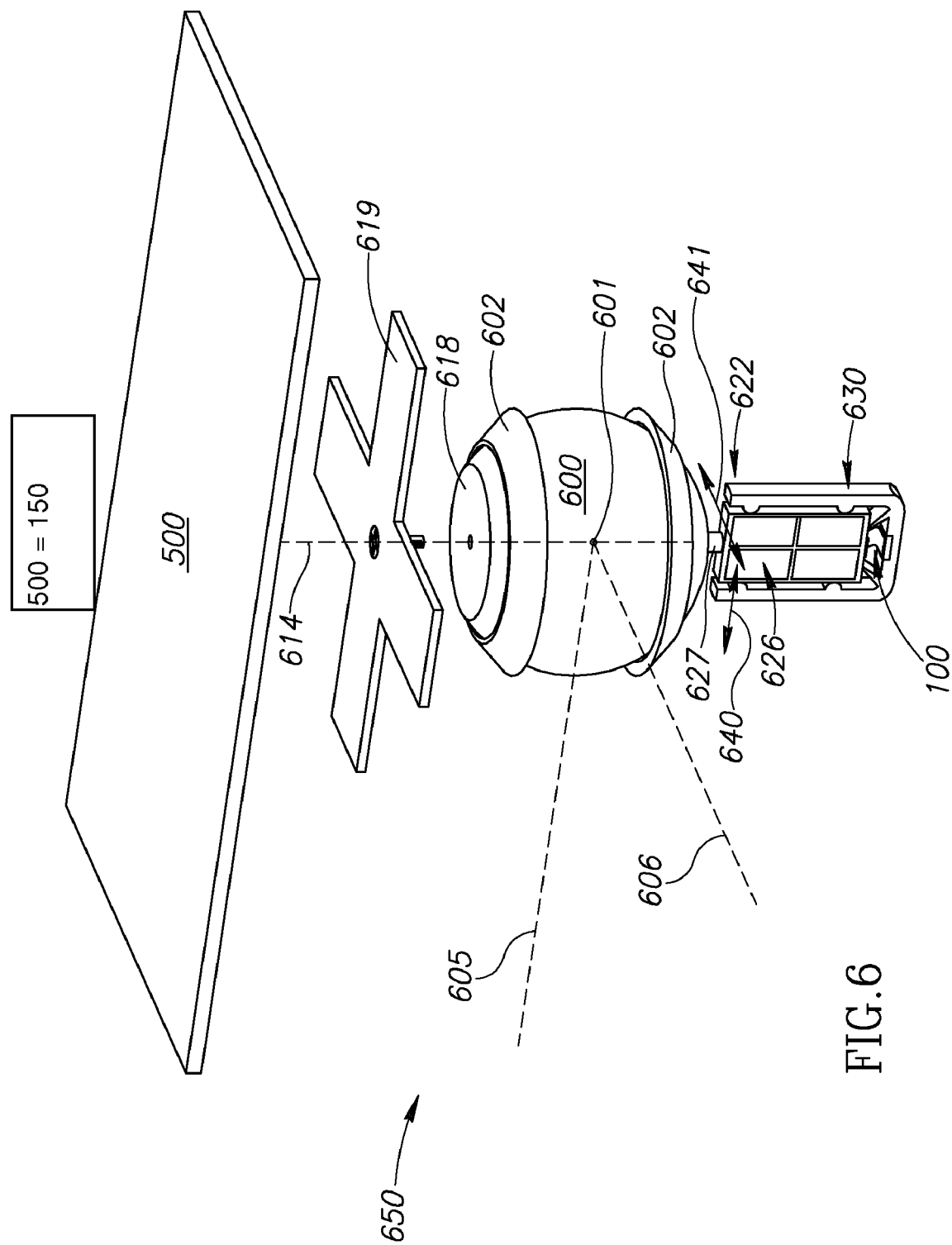
FIG. 6 schematically shows an exploded view of another mirror system comprising a mirror having its orientation controllable by a piezoelectric motor that can be selectively engaged to or disengaged from the mirror, in accordance with an embodiment of the invention.

FIG. 6 schematically shows an exploded view of a mirror system 650 in accordance with an embodiment of the invention.

Mirror system 650 optionally comprises a mirror 150 mounted to a mounting bracket 619 fixed to a facet 618 of a truncated sphere 600. Optionally, a single piezoelectric motor 622 is controllable to rotate the sphere to orient mirror 150 in different desired directions. The motor is mounted to a motor mounting frame 630 configured to resiliently press a friction nub 627 comprised in the motor to sphere 600. Optionally, motor mounting frame 630 comprises a coupling apparatus controllable to selectively engage the motor to the sphere and to disengage the motor from the sphere to enable relatively easy manual adjustment of the orientation of mirror 150. By way of example, motor mounting frame 630 comprises coupling apparatus 100 shown in FIG. 4.

Piezoelectric motor 622 comprises a thin rectangular vibrator plate 626 having a friction nub 627 located on a narrow edge surface thereof and, in accordance with an embodiment of the invention, can be controlled to apply force to sphere 600 along a plurality of different, non collinear directions. Optionally, piezoelectric motor 622 comprises a motor described in U.S. Pat. No. 7,075,211 B1, the disclosure of which is incorporated herein by reference. The motor is configured and controllable to generate transverse vibrations in its vibrator 626 and in friction nub 627 that lie substantially in a plane parallel to the plane of the motor. Transverse vibrations are controllable to apply forces to a region of the surface of sphere 600 that is contacted by friction nub 627 selectively in directions indicated by double arrowhead line 640. The "transverse" forces generate torque to rotate sphere 600 selectively in clockwise and counterclockwise directions about an axis 606 that passes through the center 601 of the sphere. Motor 622 is also configured and controllable to generate bending vibrations in its vibrator that cause vibrations, also referred to as bending vibrations, in friction nub 627 that lie in a plane that is perpendicular to the plane of the motor. Bending vibrations are controllable to apply forces to a region of the surface of sphere 600 contacted by friction nub 627 selectively in directions indicated by double arrowhead line 641. The "bending" forces generate torque to rotate sphere 600 selectively in both clockwise and counterclockwise directions about an axis 605. In accordance with an embodiment of the invention, rotations of truncated sphere 600 about axes 606 and 605 are controlled to provide a desired orientation of mirror 150.

Figure 7A:
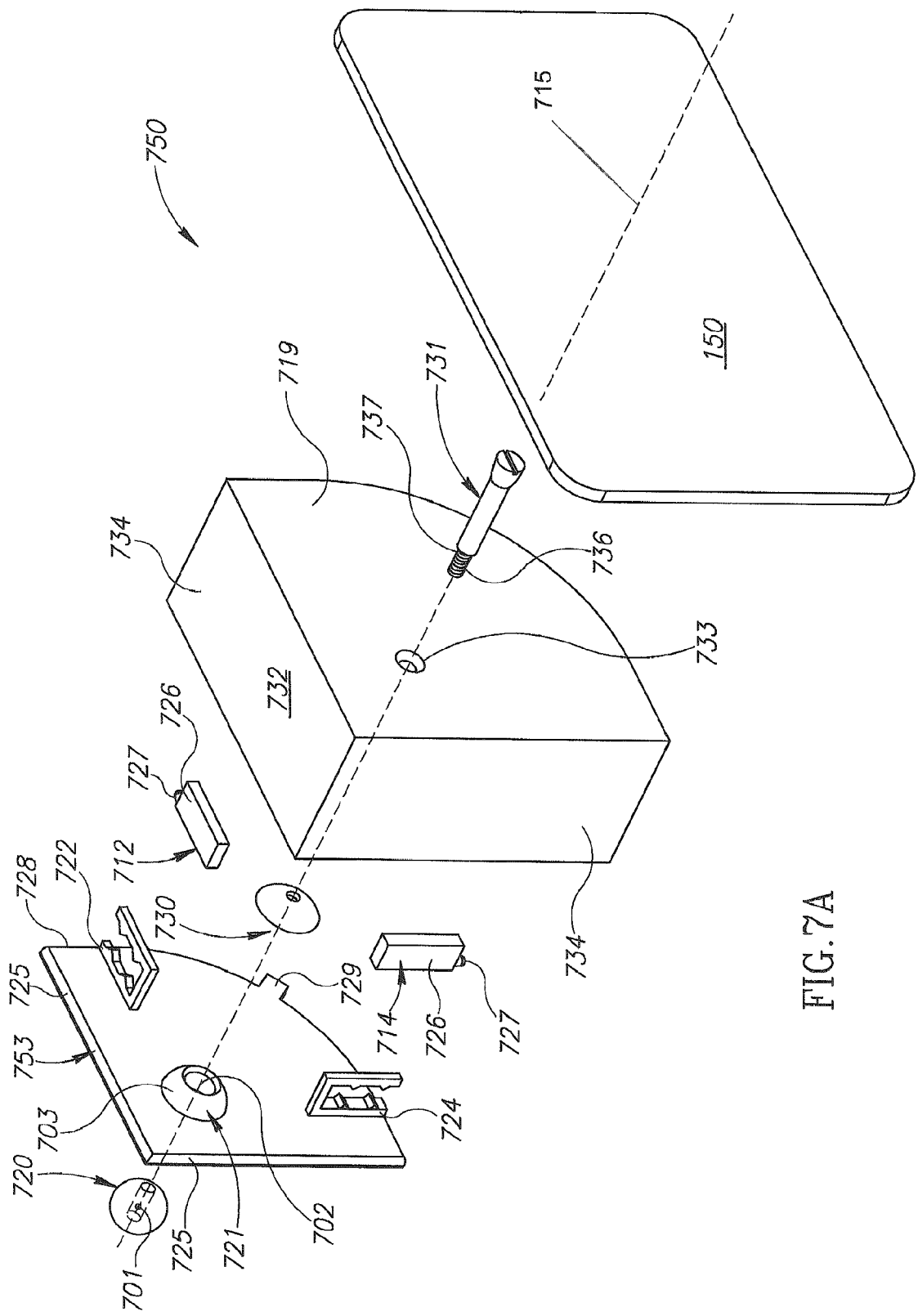
Figure 7C:
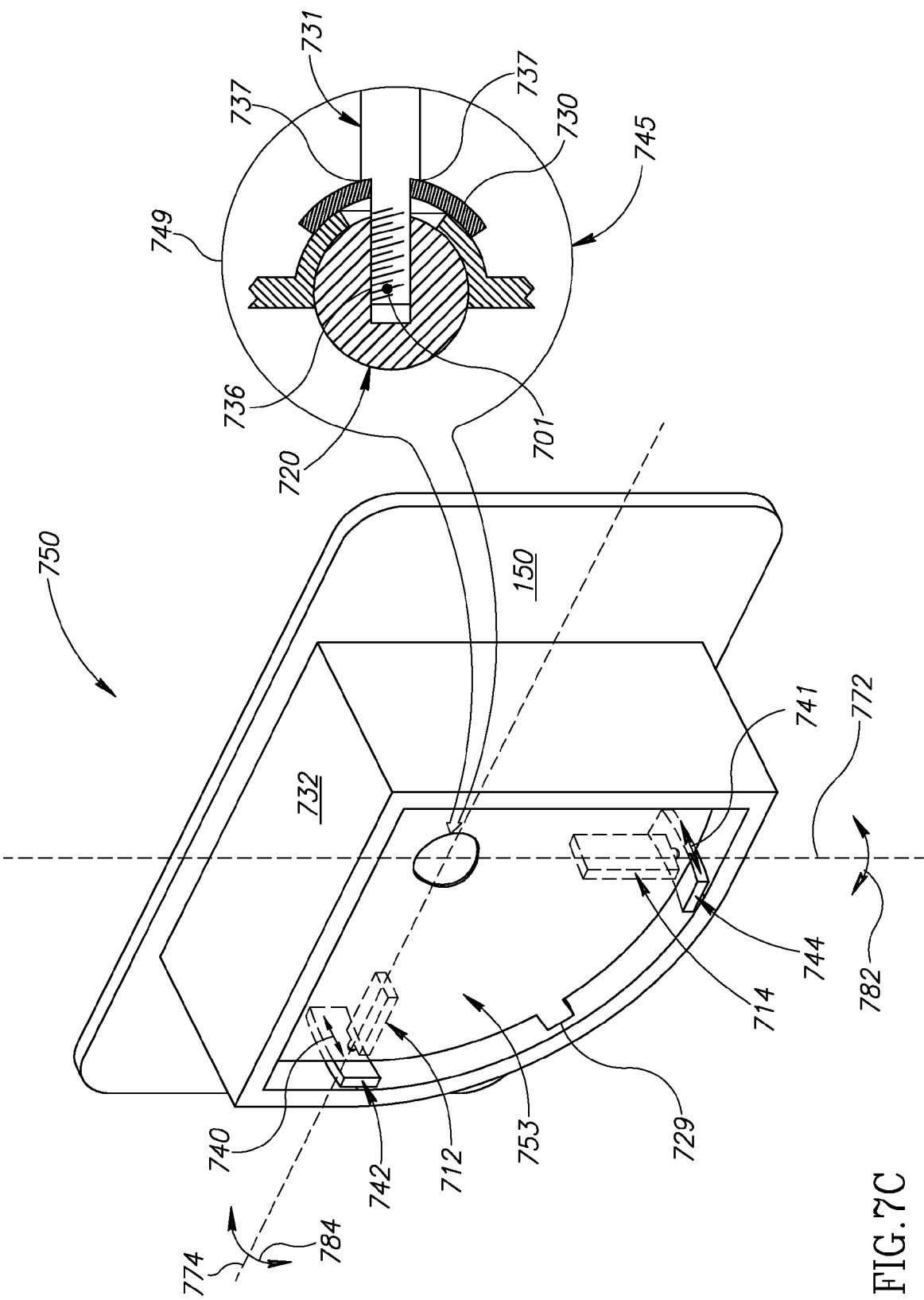
FIG. 7C schematically shows an assembled view of the mirror system shown in FIGS. 7A and 7B, in accordance with an embodiment of the invention.

FIGS. 7A and 7B schematically show exploded views of a mirror system 750 comprising a mirror 150 that is oriented by piezoelectric motors, in accordance with an embodiment of the invention. The view in FIG. 7A is shown from a viewing direction different from that of FIG. 7B. FIG. 7C schematically shows mirror system 750 assembled, in accordance with an embodiment of the invention. Mirror system 750 optionally comprises a mirror 150 mounted to a mirror mount 732 and a motor mounting plate 753 mounted with at least one motor controllable to move mirror mount 732 and thereby mirror 150 to a desired orientation.

Motor mounting plate 753 optionally has two orthogonal straight edges 725 and a circular edge 728 having a support extension 729 and is configured to be located inside mirror mount 732. The motor mounting plate comprises a ball socket 721 having a through hole 702 formed therein and comprising convex and concave surfaces 703 and 723 respectively. Mounting plate 753 additionally comprises motor mounting frames 722 and 724 for receiving and holding piezoelectric motors 712 and 714. Optionally, motors 712 and 714 are similar to motor 20 shown in FIG. 1 and each comprises a vibrator plate 726 and friction nub 727. Motor mounting frames 722 and 724 optionally hold motors 712 and 714 so that planes parallel to and passing through centers of vibrators 726 of the motors are substantially perpendicular to each other and intersect along a line 715 that passes through a center 701 of ball socket 721. Piezoelectric motor 712 is controllable to generate vibrations in its friction nub 727 that apply force selectively in directions indicated by an action line 740 (FIG. 7C) to a contact surface 742 (FIGS. 7B and 7C)

comprised in mirror mount 732 when mirror system 750 is assembled as discussed below. Similarly, piezoelectric motor 714 is controllable to generate vibrations in its friction nub 727 that apply force selectively in directions indicated by an action line 741 (FIG. 7C) to a contact surface 744 comprised in mirror mount 732.

Optionally, each of motor mounting frames 722 and 724 comprises a coupling apparatus controllable to selectively engage motor 712 and 714 respectively to its corresponding contact surface and to disengage the motor from the contact surface to enable relatively easy manual adjustment of the orientation of mirror 150. By way of example, motor mounting frame 722 and 724 may comprise coupling apparatus similar to coupling apparatus 100 shown in FIG. 4 to selectively engage and disengage motors 712 and 714.

Mirror mount 732 optionally comprises a mounting panel 719 to which mirror 150 is mountable, two perpendicular planar sidewalls 734 and a curved sidewall 735 and is formed having a countersunk mounting hole 733 for receiving an assembly bolt 731. Assembly bolt 731 is optionally a flat head bolt having a threaded end 736 and a shoulder 737. Curved wall 735 is mounted with a contact plate 742 having contact surface 762 for contact with friction nub 727 of piezoelectric motor 712 and a contact plate 744 having contact surface 764 for contact with friction nub 727 of piezoelectric motor 714. Optionally, mounting surfaces 762 and 764 are spherical surfaces having a same center of curvature. Optionally, the spherical surfaces have a same radius of curvature. Optionally, the center of curvature coincides with center 701 of ball joint 745 (FIG. 7C) when motor mounting plate 753 is mounted to mirror mount 732 as described below.

Mirror system 750 is assembled by passing assembly bolt 731 through hole 733 in mirror mount 732 and positioning a ball joint guard cap 730 against shoulder 737 of the assembly bolt. Motor mounting plate 753 is positioned inside mirror mount 732 with straight edges 725 touching flat sidewalls 734 and support extension 729 in contact with curved sidewall 735 so that threaded end 736 of assembly bolt 731 passes through hole 702 (FIGS. 7A and 7C) in ball joint socket 721 and ball joint guard cap 730 seats on convex surface 703 of the ball joint socket. With motor mounting plate 753 positioned in this manner inside mirror mount 732, friction nubs 727 of piezoelectric motors 712 and 714 contact surfaces 762 and 764 respectively substantially in central region of the contact surfaces. An optionally spherical ball joint locking nut 720 is then screwed onto threaded end 736 of assembly bolt 731 until it seats against concave surface 723 securing the assembly bolt in through hole 702 of the ball joint socket. Inset 749 in FIG. 7C schematically shows a cross section of ball and socket joint 745 with assembly bolt 731 secured in the ball joint by ball joint guard cap 730 and spherical locking nut 720. With assembly bolt 731 thus properly secured, mirror system 750 is assembled (FIG. 7C) and mirror mount 732 is rotatable relative to motor mounting plate 753 about center 701 of the ball joint but is substantially prevented from being displaced relative to the motor mounting plate in a direction along the assembly bolt.

For convenience of presentation, in the assembled view of mirror system 750 shown in FIG. 7C piezoelectric motors 712 and 714 and regions of contact plates 742 and 744 which would normally be hidden by motor mounting plate 753 are shown in dashed lines. When assembled, piezoelectric motor 712 is controllable to apply force to contact surface 762 selectively in directions indicated by double arrowhead line 740 (FIG. 7C) to rotate mirror mount 732 and thereby mirror 150 about an axis 772 clockwise or counterclockwise respectively to adjust orientation of mirror 150. Circular arrows 782 indicate clockwise and counterclockwise rotations. Piezoelectric motor 714 is similarly controllable to apply force to contact surface 764 selectively in directions indicated by double arrowhead line 741 to rotate mirror mount 732 and thereby mirror 150 about an axis 774 clockwise or counterclockwise respectively to adjust orientation of mirror 150. Circular arrows 784 indicate clockwise and counterclockwise rotations. Relatively easy manual adjustment of the orientation of mirror 150 is enabled by controlling coupling apparatus 100 optionally comprised in motor frames 722 and 724 to disengage motors 712 and 714 respectively from contact surfaces 762 and 764.

In some embodiments of the invention, the coupling apparatus, by way of example coupling apparatus 100, comprised in mirror systems 550, 650, and 750, maintains the piezoelectric motor to which it applies a coupling force disengaged from its contact surface and is activated to engage the motor. The mirror may therefore normally be oriented manually and when it is desired to have a piezoelectric motor orient the mirror, coupling apparatus 100 is activated to couple the motor to the contact surface.

In some embodiments of the invention, coupling apparatus 100 is controlled to couple the piezoelectric motor to the contact surface by manually operating an interface (not shown), such as a keyboard, touch screen, mouse or track ball of an appropriate controller (not shown). For example, coupling apparatus 100 might engage the piezoelectric motor only when a user manually activates a track ball coupled to the controller and suitably controls the track ball to orient the mirror. Optionally, the controller is programmed with a set of discrete orientation settings for the mirror and the user chooses a desired setting by appropriately operating the track ball. By way of another example, the controller interface may be a set of radio buttons. Pressing a given radio button causes the controller to activate the coupling apparatus to engage the motor and operate the piezoelectric motor to orient the mirror responsive to the given radio button.

In some embodiments of the invention, a controller for controlling coupling apparatus 100 comprises an audio sensor and is voice activated. Assuming, by way of example that the mirror system is used in a vehicle as an automotive mirror system comprising a side or rear view mirror, a person getting into a driver seat of the vehicle may recite his or her name out loud. In response, the controller activates the coupling apparatus to direct the mirror to a preprogrammed setting associated with the recited name. Since mirror setting is correlated with setting of driver seat, the controller optionally adjusts both the driver seat and the mirror to correspond to a predefined setting for each person.

In some embodiments of the invention, the mirror is activated and controlled "biometrically", for example responsive to face recognition or finger print identification. By way of a "biometric" example, a vehicle comprising an automotive mirror system in accordance with an embodiment of the invention, may be equipped with a 3D vision system comprising a 3D camera described in U.S. Pat. No. 6,100,517 that images a person sitting in the driver's seat of the vehicle. Optionally, the system processes images provided by the camera to determine size and/or identity of the person. A controller receives the size and/or identity data and controls the seat and/or mirror responsive thereto.

Whereas in the above described mirror control systems, coupling apparatus 100 maintains the piezoelectric motor normally disengaged from the contact surface, in some embodiments of the invention, the coupling apparatus is controlled to normally maintain the motor engaged to the contact surface. When engaged, the controller optionally controls the motor to perform any of the orientation functions that the motor performs when engaged as described above. The controller activates the coupling apparatus to disengage the motor and permit a user to manually orient the mirror, responsive to operation of any interface suitable for receiving appropriate inputs from the user.

For example, a voice activated controller that controls coupling apparatus 100 to normally maintain the motor engaged, may respond to the recited word "manual" to disengage the motor. Optionally, a haptic sensor determines when a human hand touches the mirror, or a control handle attached to mirror, and transmits a signal to a controller to indicate that it should disengage the piezoelectric motor and allow manual control of the mirror. Optionally, the motor or motor mounting frame is coupled to a strain gauge that generates signals when manual orientation of the mirror is attempted and the motor is engaged and the controller disengages the motor responsive to the strain gauge signals.

Whereas in the above description of a moving mirror, a coupling apparatus is controlled by controlling an SMA component to disengage or engage a piezoelectric motor, in some embodiments of a moving mirror, the motor is controlled to disengage by controlling the motor to "idle". When idling, the motor is excited so that the friction nub vibrates substantially only in a direction perpendicular to a surface region of the surface that the friction nub contacts.

FIGS. 8A-8D schematically show operation of a reflex action device (RAD) configured as a lock 310 in accordance with an embodiment of the invention. Lock 310 has a locked and unlocked state and optionally comprises a bolt 311, which is biased by a bolt coil spring 312 supported on a back plate 313. Bolt 311 has a default position shown in FIG. 8A in which the bolt seats in a catch 314 and lock 310 is in the locked state. In the figures, lock 310 is shown in a side view.

Bolt 311 is coupled to a piezoelectric motor 20, optionally by an SMA coupling apparatus schematically represented by a coil spring 320. Piezoelectric motor 20, by way of example, is similar to piezoelectric motor 20 shown in FIG. 1 and comprises a thin rectangular piezoelectric plate 22 having two diagonally opposed quadrant electrodes 28 and two diagonally opposed quadrant electrodes 29 on a first face surface thereof and a friction nub 27. A fifth electrode, not shown, is located on a second face surface of piezoelectric plate 22 opposite the face surface on which the quadrant electrodes 28 and 29 are located and covers substantially all the second side. Optionally, diagonally opposite quadrant electrodes 28 are electrically connected, as are diagonally opposite quadrant electrodes 29. Diagonal electrodes 28 are optionally floating or are optionally connected to ground, as shown in FIGS. 8A-8D. Optionally, the fifth electrode and coupling apparatus 320 are connected to ground by a suitable connection represented by a ground wire 316.

By way of example, SMA coupling apparatus 320 is configured to normally resiliently urge piezoelectric motor 20 so that its friction nub 27 presses on bolt 311 with sufficient force so that the motor is engaged. The motor is disengaged from bolt 311 when suitable power is supplied to the coupling apparatus. When engaged, piezoelectric motor 20 is operable to move bolt 311 to compress bolt bias spring 312 and extract the bolt from catch 314. Coupling apparatus 320 is optionally any coupling apparatus schematically shown in FIG. 1-FIG. 4, such as coupling apparatus 40, 70, 270, 80, 280, 300 and 100.

Piezoelectric motor 20 and coupling apparatus 320 are controlled by operating a control circuit 330. Optionally, control circuit 330 comprises a double throw triple pole switch 331, a capacitor 332, an oscillator 333 and a power-key socket 334 for receiving a power-key (not shown). In some embodiments of the invention, the power-key comprises a power source which provides energy to operate control circuit 330, piezoelectric motor 20 and/or coupling apparatus 320 when the power-key is inserted into power-key socket 334. In some embodiments of the invention, the power-key connects control circuit 330 to a power source external to the power-key for operating the control circuit, motor and/or coupling apparatus when inserted into power-key socket 334. As described below, insertion and extraction of the power-key from power-key socket 334 controls switch 331 and thereby piezoelectric motor 20, coupling apparatus 320 and the state of lock 310. For convenience of presentation, the power-key is assumed to comprise an optionally DC power source for operating lock 310.

Figure 8A:
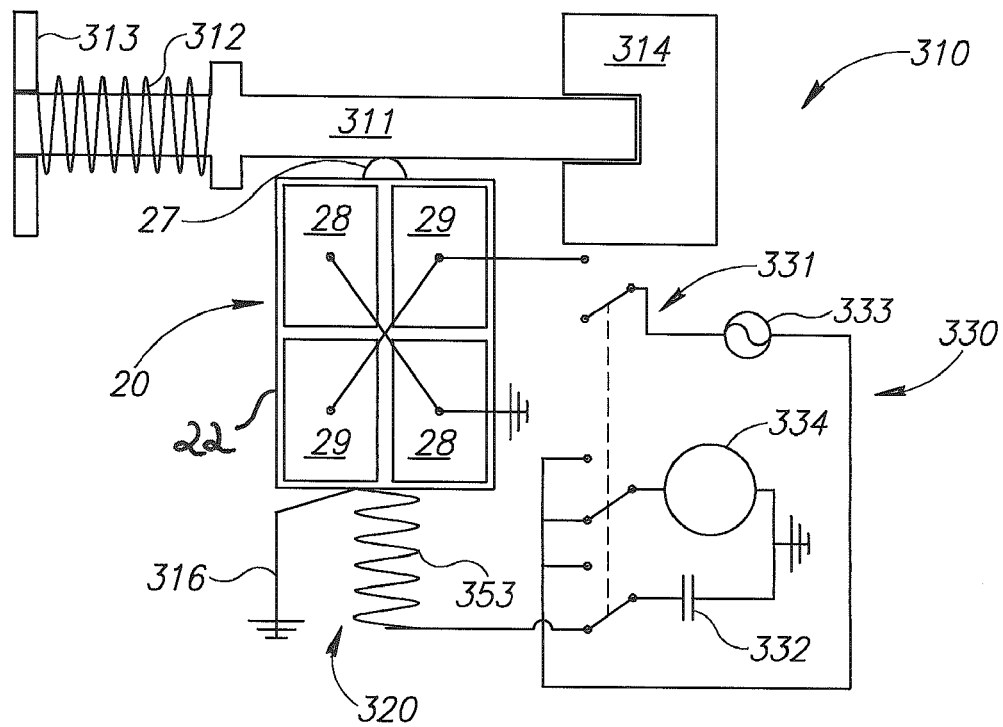
FIGS. 8A-8D schematically show and illustrate operation of a reflex action device configured as a lock, i.e. a RAD lock, in accordance with an embodiment of the invention.

In FIG. 8A, as noted above, bolt 311 is seated in catch 314 and lock 310 is in its default, locked state and coupling apparatus 320 engages piezoelectric motor 20 to bolt 311. In the locked state, switch 331 is in a first throw position in which capacitor 332 is uncharged and connected to coupling apparatus 320 and quadrant electrodes 29, and the capacitor are disconnected from power-key socket 334.

Figure 8B:
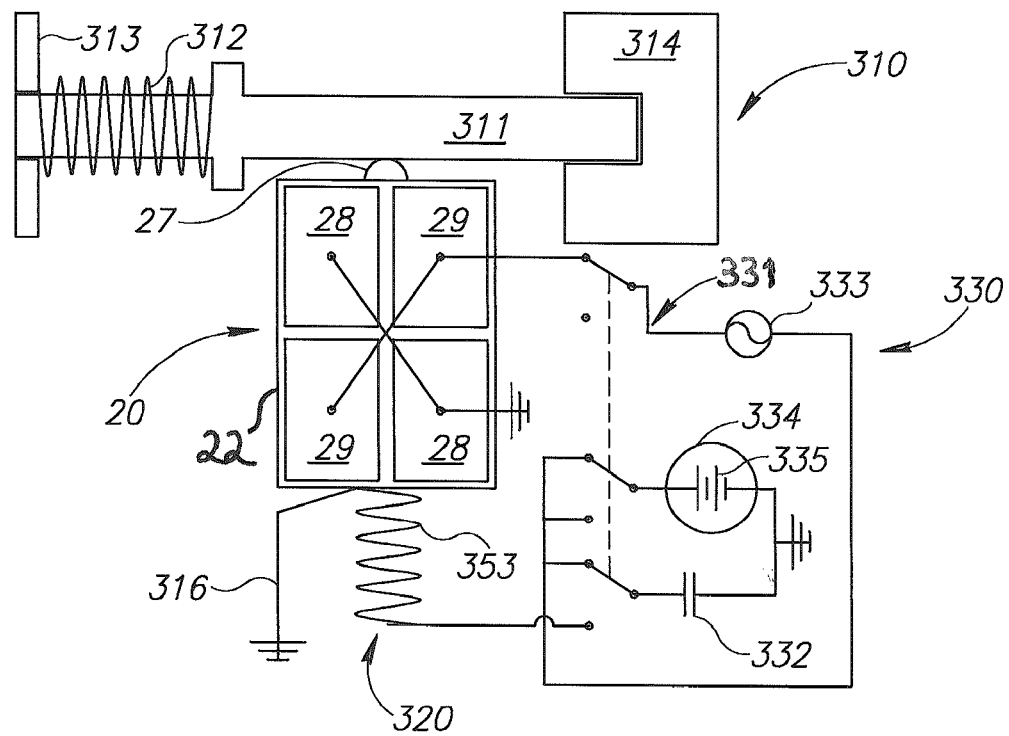

In FIG. 8B, the power-key is assumed to be inserted into power-key socket 334 and provides, optionally DC, voltage, to power lock 310 from a battery 335 comprised in the power-key. In the figure battery 335 is shown located in power-key socket 334 to indicate that the power-key is inserted and providing power to lock 310. Insertion of the power-key into power-key socket 334 causes switch 331 to switch to a second throw position in which capacitor 332 and quadrant electrodes 29 are connected to battery 335. Any of various methods and devices known in the art may be used to switch switch 331 to its second throw position responsive to insertion of the power-key. For example, switch 331 may be switched mechanically responsive to the power-key being pushed into the power-socket. Or power provided by battery 335 might be connect to a switch controller that uses power in the battery to switch the switch. (Were power to be provided from a power supply external to the power-key, insertion of the power-key into power-key socket 334 could optionally close a circuit to connect the external power supply to provide power to lock 310.)

In the second throw position, capacitor 332 is connected to battery 335, which charges the capacitor, and quadrant electrodes 29 are connected to the battery via oscillator 333. The battery charges capacitor 332 to an operating voltage, optionally equal to a voltage supplied by the battery, and oscillator 333 converts the DC voltage to AC voltage at a frequency optionally substantially equal to a resonant frequency of piezoelectric plate 22. The AC voltage applied to quadrant electrodes 29 generate elliptical vibrations in piezoelectric plate 22 and thereby in friction nub 27 that result in the friction nub applying force to bolt 311 that operates to extract the bolt from catch 314, compress bolt spring 312 and thereby open lock 310. Methods of exciting elliptical vibrations in a piezoelectric motor similar to piezoelectric motor 20 by electrifying diagonally opposite quadrant electrodes are described in U.S. Pat. No. 5,453,653, referenced above.

Figure 8C:
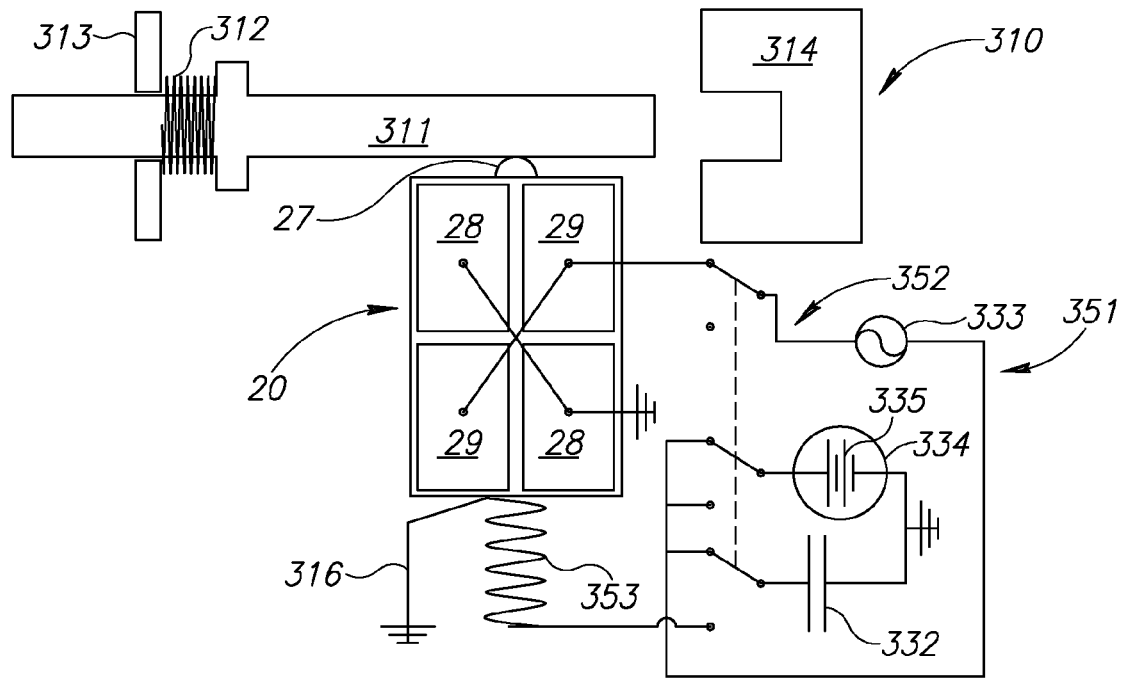

The force applied by piezoelectric motor 20 to bolt 311 moves the bolt out and away from catch 314 to a maximum distance schematically shown in FIG. 8C. Optionally, the maximum distance is a distance at which magnitude of force with which compressed spring 312 opposes motion of bolt 311 equals that which piezoelectric motor 20 applies to the bolt. Optionally, a suitable sensor and switch (not shown) determine a maximum distance that bolt 311 travels away from catch 314. For example, the switch may be a switch in series with oscillator 333. When the bolt reaches the maximum travel distance from catch 314, the sensor generates a signal that controls the switch to open and cut off power to the motor. When motor 20 is shut off, frictional force between the friction nub 27 and bolt 311 maintains the bolt at the maximum distance, bolt spring 312 compressed and lock 310 open. Optionally, the lock remains open as long as the power-key is located in power-socket 334.

Figure 8D:
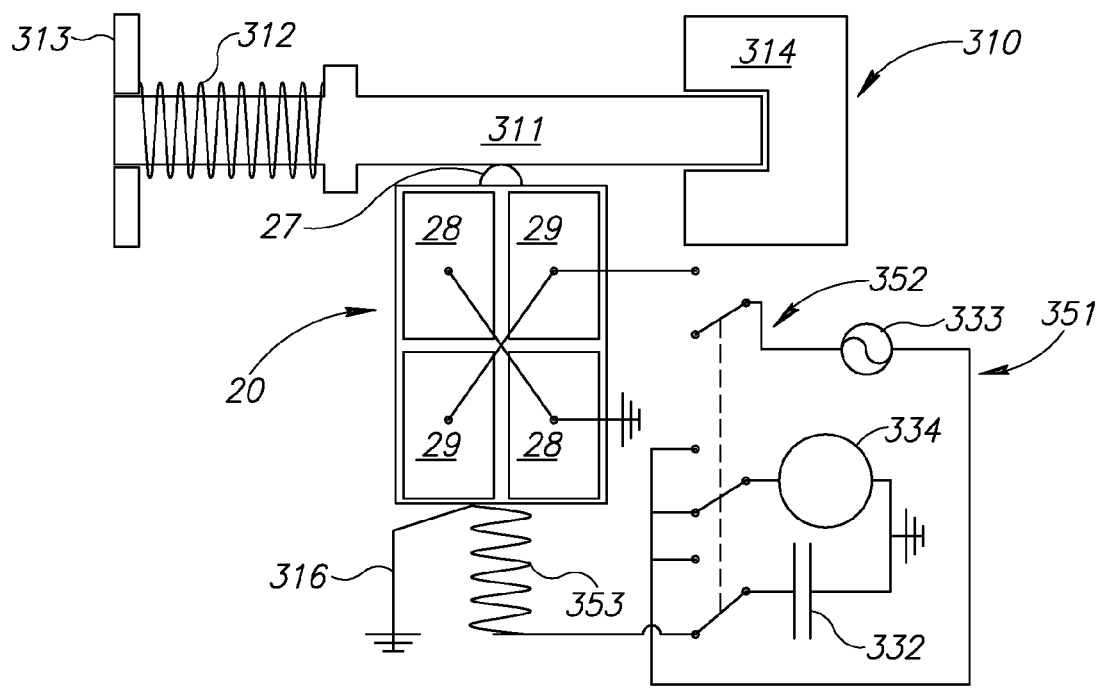

In FIG. 8D the power-key is removed from power-key socket 334. Removal of the power-key causes switch 331 to revert to the first throw position in which quadrant electrodes 29 are disconnected from control circuit 330 and capacitor 332 is connected to coupling apparatus 320. However, the capacitor was charged by battery 335 (FIG. 8B) during the time that the power-key was inserted in power-key socket 334. As a result, when the capacitor is connected to SMA coupling apparatus 320, it discharges through the coupling apparatus and provides power to the coupling apparatus causing it to disengage piezoelectric motor from bolt 311. In FIG. 8D piezoelectric motor is shown separated from bolt 311 to indicate disengagement. In practice, the piezoelectric motor is not visibly separated from bolt 311 when it is disengaged, but remains pressed to the bolt by a reduced coupling force. Once disengaged, force between friction nub 27 and bolt 311 is not sufficient to keep spring 312 compressed and the spring expands to return bolt 311 to seat in catch 314 and close lock 310. After capacitor 332 discharges through SMA coupling apparatus 320, power is no longer provided to the SMA coupling apparatus and the coupling apparatus engages piezoelectric motor 20 to bolt 311, and lock 310 returns to the locked state shown in FIG. 8A.

Figure 8E:
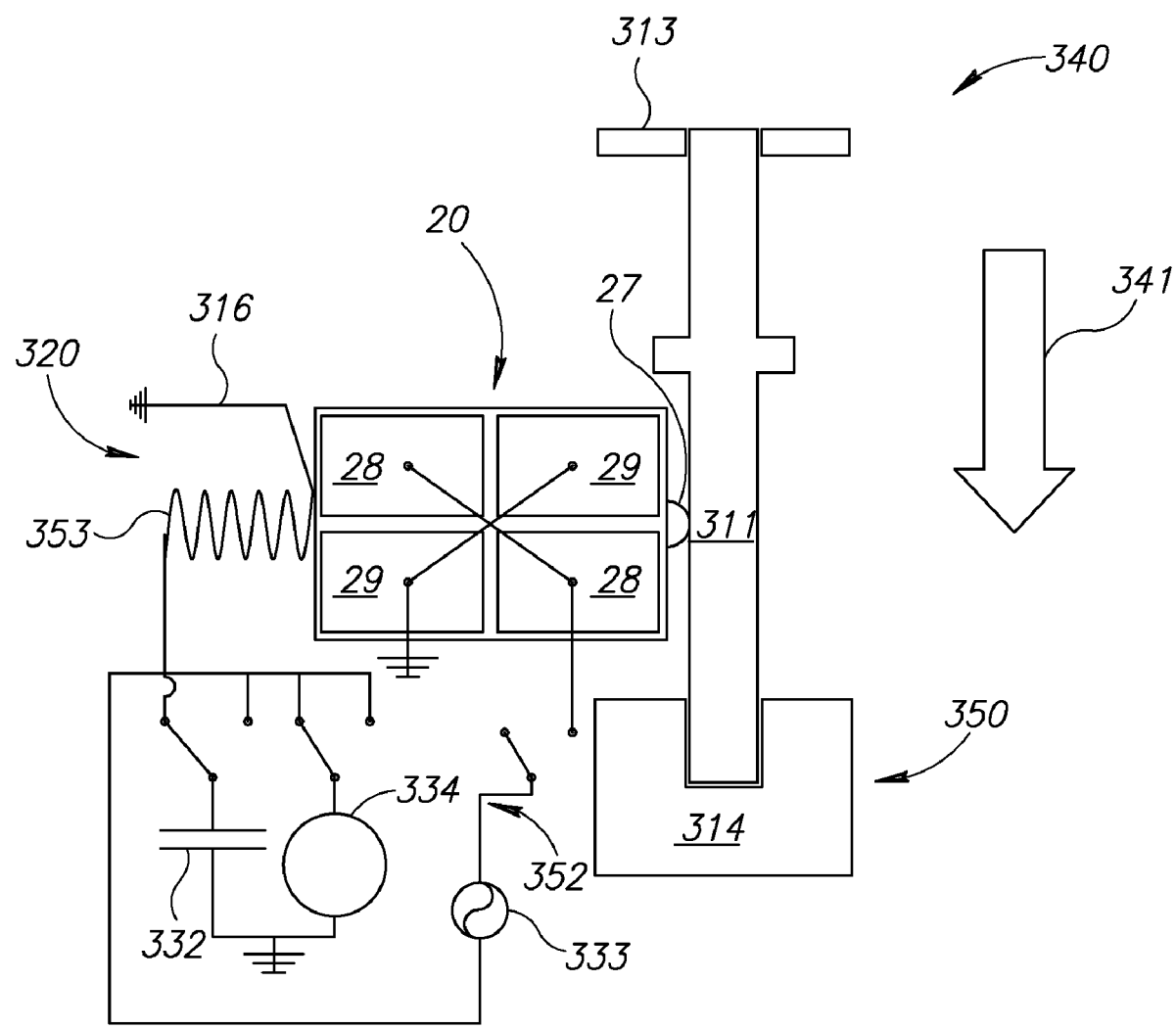
FIG. 8E schematically show and illustrate operation of a RAD lock in which gravitational potential energy is reduced to lock the lock, in accordance with an embodiment of the invention.

Whereas, in FIGS. 8A-8D bolt spring 312 operates to move bolt 311 to a default locked position in which it seats in catch 314, in some embodiments of the invention, gravity is used to return bolt 311 to the default, locked position. FIG. 8E schematically shows a lock 340 that is optionally identical to lock 310 except that lock 340 does not comprises a bolt coil spring 312. Lock 340 is assumed to be mounted in a position in which travel of bolt 311 is substantially perpendicular to the ground and therefore substantially parallel to the force of gravity. In FIG. 8E the force of gravity is indicated by a block arrow 341. When a power-key is inserted into power-key socket 334, piezoelectric motor 20 is excited to extract bolt 311 from catch 314 and raise the bolt against the force of gravity. When the power-key is extracted from the power-socket, as in lock 310, in lock 340 piezoelectric motor 20 is disengaged from bolt 311. However, whereas in lock 310 bolt spring 312 returns the bolt to seat in catch 314 when piezoelectric motor 20 is disengaged from bolt 311, in lock 340 gravity returns the bolt to seat in catch 314 and close lock 340.

FIGS. 9A-9D schematically show operation of another RAD lock 350, in accordance with an embodiment of the invention. Lock 350 is similar to lock 310 and has a default locked state in which bolt 311 seats in catch 314. However, lock 350 does not comprise an SMA coupling apparatus such as coupling apparatus 320 to engage and disengage piezoelectric motor 20 from bolt 311. Instead, a biasing spring 353 operates to provide a substantially constant force that resiliently urges friction nub 27 to bolt 311 and engage piezoelectric motor 20 to the bolt. A control circuit 351 controls vibrations in piezoelectric motor 20 so that the motor "idles", to disengage the piezoelectric motor as described below.

Control circuit comprises a capacitor 332, an oscillator 333 and a four-pole double throw switch 352. In a locked state of lock 350 shown in FIG. 9A, switch 352 is in a first throw in which capacitor 332 is discharged, quadrant electrodes 28 and 29 are shorted together and electrically connected to the capacitor, and the capacitor and quadrant electrodes are disconnected from power-key socket 334.

Figure 9A:
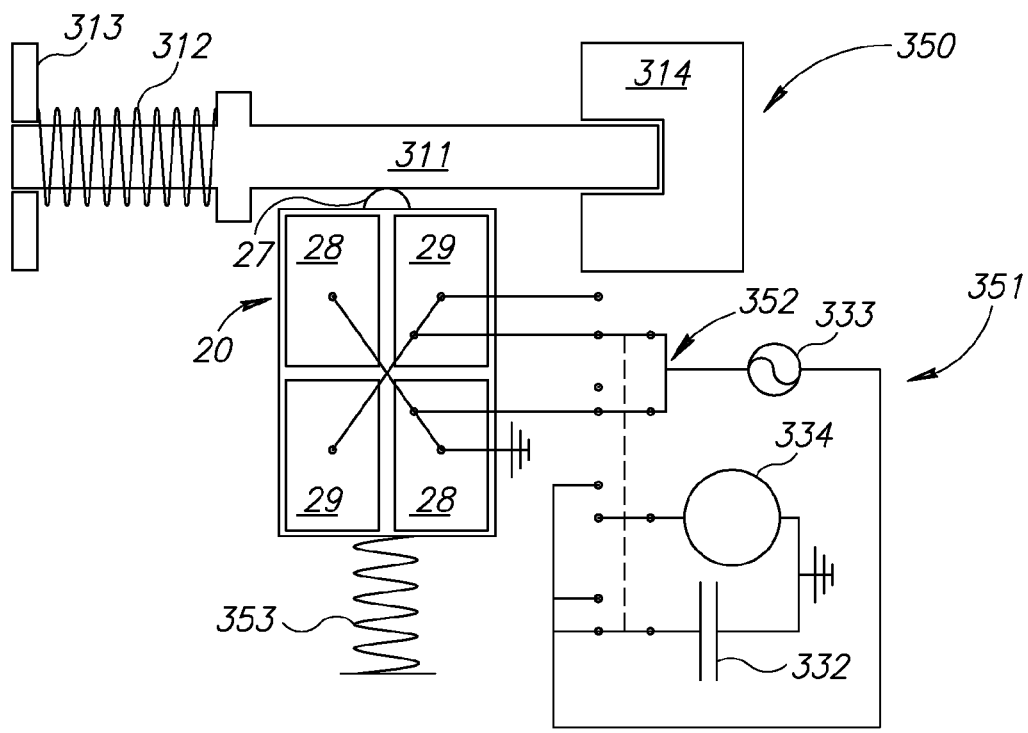
FIGS. 9A-9D schematically show and illustrate operation of another RAD lock, in accordance with an embodiment of the invention.
Figure 9B:
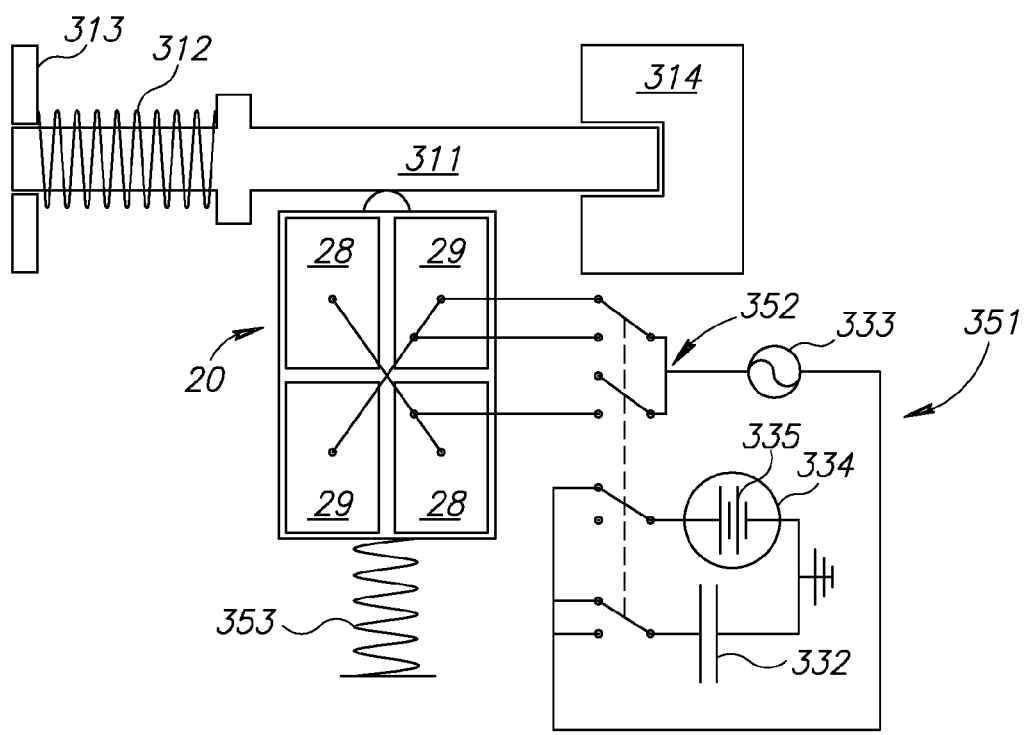

In FIG. 9B a power-key is inserted into power-key socket 334 thereby connecting a power source to circuit 351 and causing switch 352 to switch to a second throw. Optionally the power source is a battery 335 comprised in the power-key and shown in power-key socket 334. In the second throw, capacitor 332 is connected to and charged by battery 335 and the battery provides AC voltage to quadrant electrodes 29 via oscillator 333.

Figure 9C:
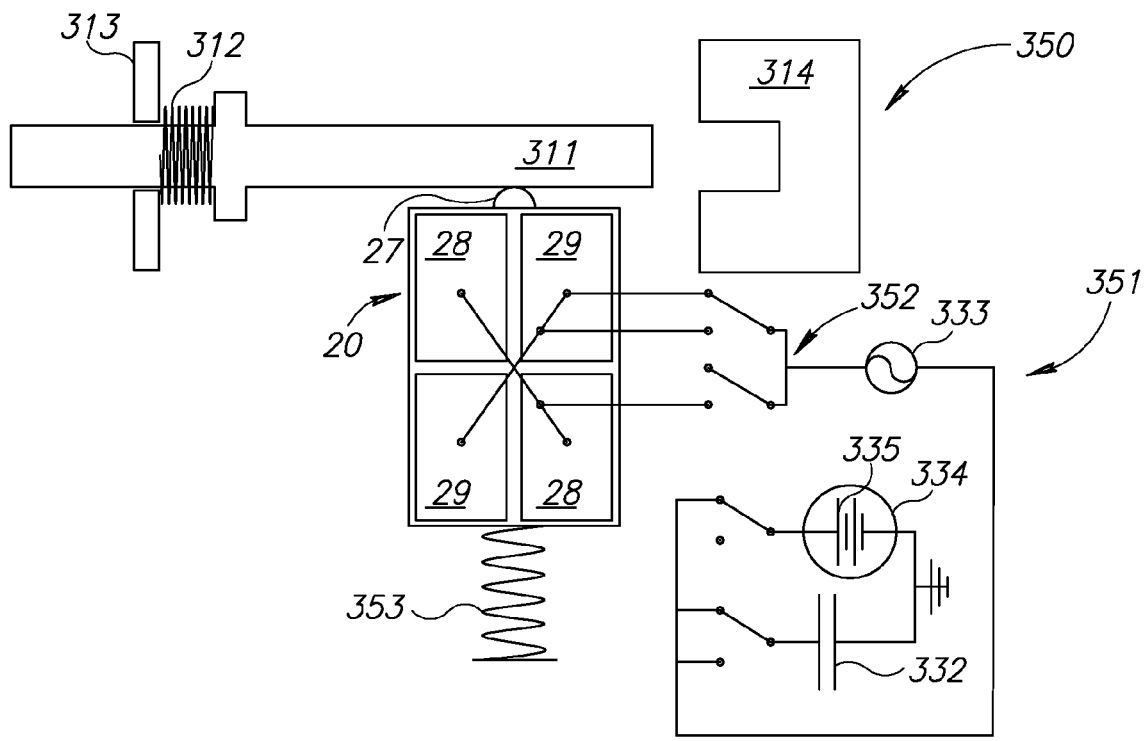

Similarly to operation of lock 310 in lock 350 the AC voltage provided to quadrant electrodes 29 causes piezoelectric motor 20 to extract and displace bolt 311 from catch 314 and compress spring bolt 312 as schematically shown in FIG. 9C. The bolt is maintained displaced from catch 314 and spring 311 compressed by frictional force between friction nub 27 and the bolt generated by force applied to piezoelectric motor 20 by biasing spring 353.

Figure 9D:
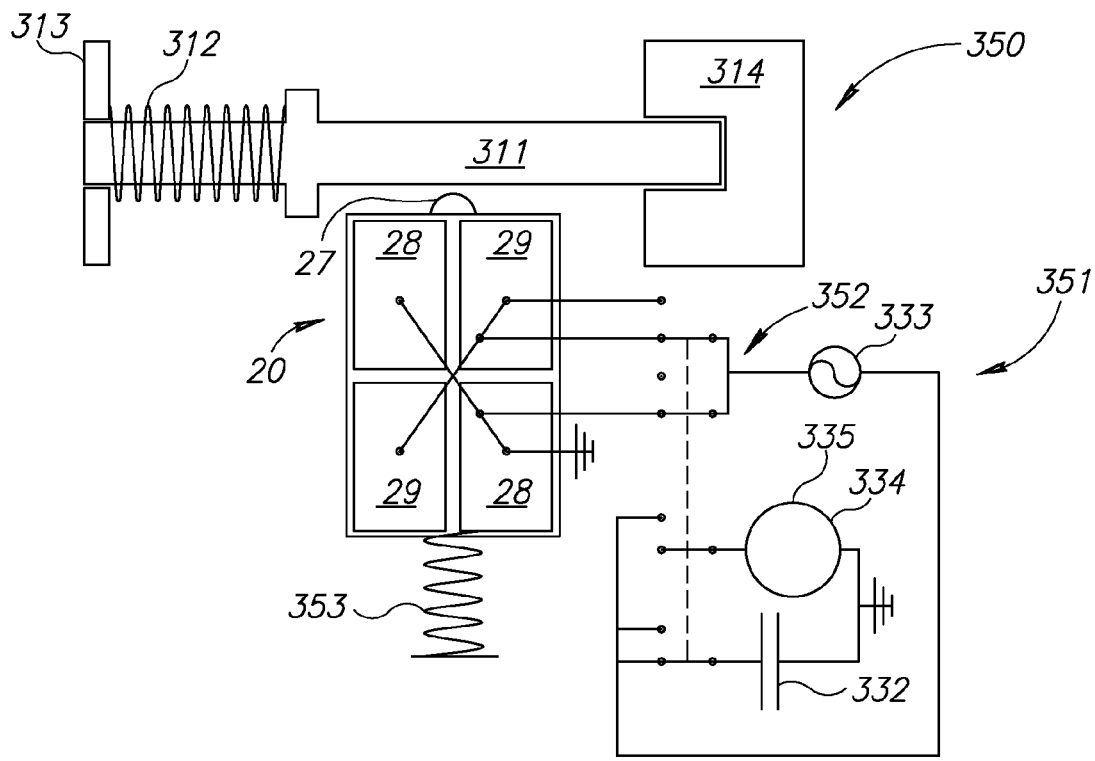

In FIG. 9D the power-key is assumed to be removed from power-key socket 334. Removal of the power key causes switch 352 to return to its first throw position and disconnect battery 335 from capacitor 332 and quadrant electrodes 29. However, in returning to its first throw position switch 352 connects quadrant electrodes 28 and 29 to charged capacitor 332 via oscillator 333. The charged capacitor via oscillator 333 provides a same AC voltage to quadrant electrodes 28 and 29 causing piezoelectric plate to vibrate in a longitudinal mode in which friction nub 27 vibrates substantially only along a normal to bolt 311. The longitudinal vibrations reduce frictional force between the friction nub and the bolt allowing compressed bolt spring 311 to expand and return bolt 311 to its default position in which it seats in catch 314. Longitudinal vibrations continue until capacitor 332 discharges to a state in which it no longer provides energy to generate vibrations in piezoelectric plate 22 and lock 350 returns to its default, locked state shown in FIG. 9A.

It is noted that any of various piezoelectric motors may be used in place of or in addition to piezoelectric motors similar to those shown in the above figures to provide motion for a reflex action device such as locks 310 and 350 or a mirror, in accordance with an embodiment of the invention. For example, a multilayer motor described in U.S. Pat. No. 7,075,211, the disclosure of which is incorporated herein by reference may be used in place of a motor similar to piezoelectric motors 20 shown in the figures. In addition, various methods of driving piezoelectric motors other than that shown and/or described above may be used to drive the motors. For example, driving methods described in U.S. Pat. Nos. 7,075,211, 6,879,085 and 6,661,153, the disclosures of which are incorporated herein by reference, may be used to drive motors.

In the description and claims of the present application, each of the verbs, "comprise" "include" and "have", and conjugates thereof, are used to indicate that the object or objects of the verb are not necessarily a complete listing of members, components, elements or parts of the subject or subjects of the verb.

The invention has been described using detailed descriptions of embodiments thereof that are provided by way of example and are not intended to limit the scope of the invention. The described embodiments comprise different features, not all of which are required in all embodiments of the invention. Some embodiments of the invention utilize only some of the features or possible combinations of the features. Variations of embodiments of the invention that are described and embodiments of the invention comprising different combinations of features noted in the described embodiments will occur to persons of the art. For example, whereas some SMA components discussed above are heated by passing a current through them, in some embodiments of the invention the SMA components are heated by thermal contact with a suitable heating element, such as a Peltier heater. And, an SMA control wire such as SMA control wire 47 may be coupled to a coil or portion of a coil spring by methods other than an anchor plate. For example, the control wire may be bonded directly to a coil or coupled to a bar that extends across and is attached to a coil. The scope of the invention is limited only by the following claims.

The invention claimed is:

1. A mirror system comprising:
   a mirror;
   a moveable body operably connected to the mirror;
   a friction nub for controlling the motion and positioning of moveable body;
   at least one piezoelectric motor operably couple-able to the friction nub and to the moveable body;
   a motor mounting frame that holds a piezoelectric motor of the at least one piezoelectric motor; and
   a coupling apparatus operably connected to the motor mounting frame, the coupling apparatus controllable and configured to provide different coupling forces to the moveable body and the coupling apparatus comprises a shape memory alloy connected to a power supply,
   whereby the mirror is operably engaged or disengaged by controlling the temperature of the shape memory alloy with respect to a transition temperature of the alloy so that the mirror position can be adjusted by one of the at least one piezoelectric motors when the mirror is operably engaged and allowing movement of the mirror without substantial resistance when the mirror is disengaged.

2. A mirror system according to claim 1, further comprising a spherical contact plate coupled to the mirror wherein the spherical contact plate comprises a surface of a truncated sphere having a facet to which the mirror is fixed.

3. A mirror system according to claim 2 wherein the at least one piezoelectric motor comprises a first piezoelectric motor controllable to rotate the sphere about an axis through the center of the sphere and a second piezoelectric motor controllable to rotate first motor to rotate thereby the axis about which the first piezoelectric motor rotates the sphere.

4. A mirror system according to claim 2 wherein the at least one motor comprises a first piezoelectric motor coupled to the sphere controllable to rotate the sphere selectively about first and second orthogonal axes of rotation that pass through the center of the sphere.

5. A mirror system according to claim 1 wherein the at least one motor comprises first and second motors.

6. A mirror system according to claim 5 wherein the at least one coupling surface comprises first and second contact surfaces to which the contact surfaces of the first and second piezoelectric motors are respectively pressed.

7. A mirror system according to claim 6 and comprising a mirror mount having a first surface to which the mirror is mounted and at least one second surface to which the first and second contact surfaces are mounted.

8. A mirror system according to claim 7 wherein the first and second contact surfaces have a same center of curvature.

9. A mirror system according to claim 7 wherein the first and second contact surfaces have a same radius of curvature.

10. A mirror system according to claim 7 wherein the first motor is controllable to apply force to the first contact surface that rotates the mirror about a first axis and the second motor is controllable to apply force to the second contact surface that rotates the mirror about a second axis substantially orthogonal to the first axis.

11. A mirror system according to claim 7 and comprising a motor mount that fits inside the mirror mount and comprises first and second motor mounting frames that hold the first and second motors.

12. A mirror system according to claim 11 and comprising a ball joint that couples the motor mount to the mirror mount.

13. A mirror system according to claim 1 wherein the motor mounting frame comprises a coupling apparatus controllable to selectively provide different coupling forces for coupling the coupling surface of the piezoelectric motor to the contact surface.

14. A mirror system according to claim 13 wherein the coupling apparatus is controllable to determine coupling force magnitude to selectively engage the motor to, or disengage the motor from, the contact surface.

15. Apparatus comprising:
    a moveable body having first and second positions;
    a piezoelectric motor controllable to move the body from the first to the second position;
    an element that stores potential energy whose potential energy increases when the piezoelectric motor moves the body from the first to the second positions; and
    coupling apparatus controllable to decouple the motor from the body;
    wherein the potential energy decreases and causes the body to return to the first position when the coupling apparatus decouples the motor from the body.

16. Apparatus according to claim 15 wherein the potential energy comprises mechanical potential energy.

17. Apparatus according to claim 16 wherein the element that stores potential energy is an elastic element.

18. Apparatus according to claim 16 wherein the mechanical potential energy comprises gravitational potential energy.

19. Apparatus according to claim 18 wherein the element that stores potential energy is a body whose gravitational potential energy increases when the body moves from the first to the second position.

20. Apparatus according to claim 15 wherein the potential energy comprises electromagnetic potential energy.

21. Apparatus according to claim 20 wherein the element that stores electromagnetic potential energy is a capacitor.

22. Apparatus according to claim 15 wherein the coupling apparatus comprises a shape memory alloy that changes between austenite and martensite phases to control coupling of the piezoelectric motor to the moveable body.

23. Apparatus according to claim 15 wherein the coupling apparatus comprises a circuit configured to excite vibrations of the piezoelectric motor substantially only in a direction parallel to a normal to a surface region of the moveable body to which the motor is pressed to decouple the motor from the moveable body.

24. Apparatus according to claim 15 wherein the apparatus comprises a lock wherein in one of the first and second positions of the moveable body the lock is locked and in the other the lock is unlocked.

* * * * *